(12) United States Patent
Zhu et al.

(10) Patent No.: US 10,205,426 B2
(45) Date of Patent: *Feb. 12, 2019

(54) MULTISTAGE AMPLIFIER LINEARIZATION IN A RADIO FREQUENCY SYSTEM

(71) Applicant: Skyworks Solutions, Inc., Woburn, MA (US)

(72) Inventors: Yu Zhu, Wellesley, MA (US); Dylan Charles Bartle, Arlington, MA (US); Oleksiy Klimashov, Burlington, MA (US); Paul T. DiCarlo, Marlborough, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/679,518

(22) Filed: Aug. 17, 2017

(65) Prior Publication Data

US 2018/0069511 A1 Mar. 8, 2018

Related U.S. Application Data

(63) Continuation of application No. 15/191,938, filed on Jun. 24, 2016, now Pat. No. 9,813,029.

(Continued)

(51) Int. Cl.
*H04B 1/04* (2006.01)
*H03F 3/45* (2006.01)
(Continued)

(52) U.S. Cl.
CPC ......... *H03F 1/3205* (2013.01); *H03F 1/0266* (2013.01); *H03F 1/32* (2013.01);
(Continued)

(58) Field of Classification Search
CPC ........ H03F 1/32; H03F 1/0205; H03F 1/3205; H03F 1/342; H03F 3/19; H03F 3/193;
(Continued)

(56) References Cited

U.S. PATENT DOCUMENTS 5,455,538 A 10/1995 Kobayashi
6,141,541 A 10/2000 Midya et al.
(Continued)

OTHER PUBLICATIONS

Akmal, et al., "The effect of baseband impedance termination on the linearity of GaN HEMTs," Proceedings of the 40$^{th}$ European Microwave Conference, pp. 1046-1049, Sep. 2010.
(Continued)

*Primary Examiner* — Quochien B Vuong
(74) *Attorney, Agent, or Firm* — Knobbe, Martens, Olson & Bear, LLP

(57) ABSTRACT

A linearization circuit reduces intermodulation distortion in an amplifier that includes a first stage and a second stage. The linearization circuit receives a first signal that includes a first frequency and a second frequency and generates a difference signal having a frequency approximately equal to the difference of the first frequency and the second frequency, generates an envelope signal based at least in part on a power level of the first signal, and adjusts a magnitude of the difference signal based on the envelope signal. When the amplifier receives the first signal at an input terminal, the first stage receives the adjusted signal, and the second stage does not receive the adjusted signal, intermodulation between the adjusted signal and the first signal cancels at least a portion of the intermodulation between the first frequency and the second frequency from the output of the amplifier.

20 Claims, 22 Drawing Sheets

Related U.S. Application Data

(60) Provisional application No. 62/235,054, filed on Sep. 30, 2015, provisional application No. 62/187,018, filed on Jun. 30, 2015.

(51) Int. Cl.

| | | |
|---|---|---|
| *H03F 1/32* | (2006.01) | |
| *H03F 3/24* | (2006.01) | |
| *H03F 3/193* | (2006.01) | |
| *H03F 3/19* | (2006.01) | |
| *H04B 1/48* | (2006.01) | |
| *H04B 1/40* | (2015.01) | |
| *H04B 1/3827* | (2015.01) | |
| *H04B 1/525* | (2015.01) | |
| *H03F 1/02* | (2006.01) | |
| *H03F 3/195* | (2006.01) | |
| *H03F 3/21* | (2006.01) | |
| *H04W 88/02* | (2009.01) | |

(52) U.S. Cl.
CPC .............. *H03F 3/19* (2013.01); *H03F 3/193* (2013.01); *H03F 3/195* (2013.01); *H03F 3/211* (2013.01); *H03F 3/245* (2013.01); *H03F 3/4508* (2013.01); *H03F 3/45179* (2013.01); *H04B 1/3827* (2013.01); *H04B 1/40* (2013.01); *H04B 1/48* (2013.01); *H04B 1/525* (2013.01); *H03F 2200/102* (2013.01); *H03F 2200/105* (2013.01); *H03F 2200/15* (2013.01); *H03F 2200/294* (2013.01); *H03F 2200/451* (2013.01); *H03F 2201/3215* (2013.01); *H03F 2201/3236* (2013.01); *H04B 2001/485* (2013.01); *H04W 88/02* (2013.01)

(58) Field of Classification Search
CPC .............. H03F 3/195; H03F 2200/102; H03F 2200/372; H03F 2200/451; H03F 2200/555; H04B 1/04; H04B 1/40; H04B 1/0475; H04B 2001/0408; H04B 2001/0425
USPC ........... 455/63.1, 67.13, 114.1, 114.2, 114.3, 455/115.1, 115.3, 127.1, 232.1, 234.1, 455/239.1, 295, 296; 330/149, 250, 251, 330/253, 285, 296, 299, 300; 375/296, 375/297
See application file for complete search history.

(56) References Cited

U.S. PATENT DOCUMENTS

| | | |
|---|---|---|
| 6,320,464 B1 | 11/2001 | Suzuki et al. |
| 6,496,065 B1 | 12/2002 | Kim |
| 6,717,980 B1 | 4/2004 | Rishi |
| 6,725,021 B1 | 4/2004 | Anderson et al. |
| 7,053,709 B1 | 5/2006 | Darvish-Zadeh et al. |
| 7,276,966 B1 | 10/2007 | Tham et al. |
| 7,656,229 B2 | 2/2010 | Deng et al. |
| 7,821,337 B2 * | 10/2010 | Yamanouchi ......... H03F 1/3223 330/149 |
| 8,106,712 B2 | 1/2012 | Lee et al. |
| 8,803,605 B2 | 8/2014 | Fowers et al. |
| 9,002,303 B2 | 4/2015 | Brobston |
| 9,438,186 B2 | 9/2016 | Srinidhi et al. |
| 9,496,838 B2 | 11/2016 | Winieck |
| 9,813,029 B2 | 11/2017 | Zhu et al. |
| 9,893,682 B2 | 2/2018 | Zhu et al. |
| 2009/0072901 A1 | 3/2009 | Yamanouchi |
| 2017/0005623 A1 | 1/2017 | Zhu |
| 2017/0005624 A1 | 1/2017 | Zhu |
| 2017/0005625 A1 | 1/2017 | Zhu |
| 2017/0005626 A1 | 1/2017 | Zhu |
| 2018/0167037 A1 | 6/2018 | Zhu et al. |

OTHER PUBLICATIONS

Asbeck, et al., "ET comes of age," IEEE Microw. Mag., vol. 17, No. 3, Mar. 2016, pp. 16-25.

Auer, et al., "Linearity and efficiency improvement using envelope tracking power amplifier," 2016 German Microwave Conference, 2016, pp. 88-91.

C. Fager, et al., "A Comprehensive Analysis of IMD Behavior in RF CMOS Power Amplifiers," IEEE Journal of Solid-State Circuits, vol. 39, No. 1, pp. 24-34 Jan. 1, 2004.

Hu, et al., "A new method of third-order intermodulation reduction in nonlinear microwave systems," IEEE Trans. Microw. Theory Techn., vol. 34, No. 2, pp. 245-250, 1986.

Imai, et al., "Novel Linearizer Using Balanced Circulators and Its Application to Multilevel Digital Radio Systems," IEEE Transactions on Microwave Theory and Techniques, vol. 37, No. 8, pp. 1237-1243, Aug. 1989.

Kang, et al., "Analysis and Design of Feedforward Power Amplifier," IEEE MTT-S Digest, pp. 1519-1522, 1997.

Kim, et al., "High efficiency and wideband envelope tracking power amplifier with sweet spot tracking," IEEE Radio Frequency integrated circuits symposium, pp. 255-258, 2010.

Kim, et al., "Optimization for envelope shaped operation of envelope tracking power amplifier," IEEE Trans. Microw. Theory Techn., vol. 59, No. 7, pp. 1787-1795, 2011.

Leung, et al., "A new approach to amplifier linearization by the generalized baseband signal injection method," IEEE Microw Compon. Lett., vol. 12, No. 9, pp. 336-338, 2002.

Liu, et al., "BSIM3v3.2.2 MOSFET Model," Department of Electrical Engineering and Computer Sciences, University of California, Berkeley, CA 94720, 228 pages, 1999.

Lou, et al., "A linearization technique for RF receiver front-end using second-order-intermodulation injection," IEEE J. Solid-State Circuits, vol. 43, No. 11, pp. 2404-2412, 2008.

Maas, "A GaAs MESFET Mixer with Very Low Intermodulation," IEEE Transactions on Microwave Theory and Techniques, vol. MTT-35, No. 4, pp. 425-429, Apr. 1987.

McCune, "Operating modes of dynamic power supply transmitter amplifiers," IEEE Trans. Microw. Theory Techn., vol. 62, No. 11, pp. 2511-2517, 2014.

Moazzam, et al., "A Low Third Order Intermodulation Amplifier with Harmonic Feedback Circuitry," IEEE MTT-S Digest, pp. 827-830, 1996.

Mokhti, et al., "Investigating the linearity versus efficiency tradeoff of different power amplifier modes in an envelope tracking architecture," Proceedings of the 10th European Microwave Integrated Circuits Conference, pp. 357-360, 2015.

Moon, et al., "Optimization of Idle current in envelope tracking power amplifier for efficiency and linearity," Proceedings of the 11th European Microwave Integrated Circuits, pp. 141-144, Oct. 2016.

Wang, et al., "Envelope tracking power amplifiers for wire communications," Boston: Artech House, 2014, pp. 75-81.

Wu, et al., "Performance analysis of envelope tracking power amplifier's envelope shaping methods for LTE mobile terminal application," 2014 IEEE 25th International Symposium on Personal, Indoor and Mobile Radio Communications, pp. 768-773.

Yang, et al., "A new linear amplifier using low-frequency second-order intermodulation component feedforwarding," IEEE Microw. Guided Wave Lett., vol. 9, No. 10, pp. 419-421, 1999.

Yusoff, et al., "Linearity improvement in RF power amplifier system using integrated auxiliary envelope tracking system," IEEE MTT-S Int. Microwave Symp. Dig., 2011, pp. 1-4.

Zhu, et al., "Analysis, simulation, and measurement of envelope tracking linearization," 2016 Asia-Pacific Microwave Conference, TU1B-5.

(56) References Cited

OTHER PUBLICATIONS

Zhu, et al., "Novel Shaping Function for Envelope Tracking Linearization," Skyworks Solutions, Inc., Woburn, MA, 4 pages.

* cited by examiner

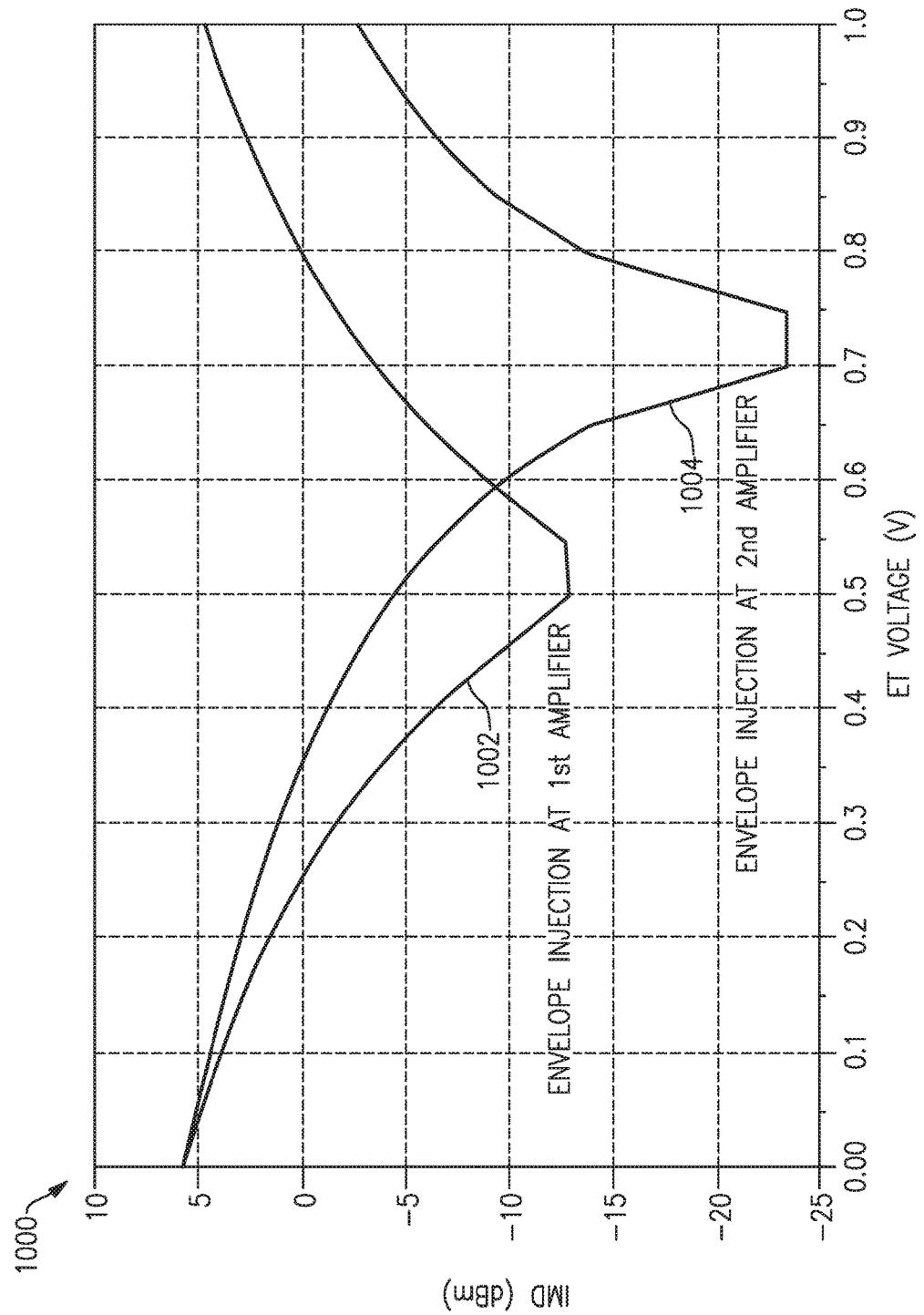

W/O ET (Vdd = 3.75V)

W/ ET (Linear shaping table)

MULTISTAGE AMPLIFIER LINEARIZATION IN A RADIO FREQUENCY SYSTEM

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the invention relate to electronic systems, and in particular, to radio frequency (RF) electronics.

Description of the Related Technology

Intermodulation distortion (IMD) is the amplitude modulation of signals containing two or more different frequencies in a system with nonlinearities. The intermodulation between each frequency component will form additional signals at frequencies that are not just at harmonic frequencies of either, but also at the sum and difference frequencies of the original frequencies and at multiples of those sum and difference frequencies. An ideal amplifier would be a linear device, but real amplifiers are nonlinear, and when amplifying input signals containing two or more different frequencies, amplifier output signals exhibit intermodulation distortion. Amplifiers can comprise bipolar junction transistors (BJT) having a base, a collector, and an emitter, and field effect transistors (FET) having a gate, a drain, and a source.

SUMMARY

According to a number of embodiments, the disclosure relates to a method to improve amplifier linearity for a differential amplifier. The method comprises receiving at an input terminal of a differential amplifier a first signal including signal components having a first frequency and signal components having a second frequency, where the differential amplifier includes at least a first amplifier circuit and a second amplifier circuit, generating a second signal having a third frequency approximately equal to the difference between the first frequency and the second frequency, adjusting an amplitude of the second signal based at least in part on a power level of the first signal, and applying the second signal to the first amplifier circuit and not to the second amplifier circuit to cancel at least a portion of intermodulation components in a third signal being output from the differential amplifier.

In an embodiment, the intermodulation components include third order intermodulation products of the first and second frequencies. In another embodiment, the first amplifier circuit includes one or more field effect transistors (FETs). In a further embodiment, the second signal is applied to a drain of the first amplifier circuit. In a yet further embodiment, the first amplifier circuit includes one or more bipolar junction transistors (BJTs). In an embodiment, the second signal is applied to a collector of the first amplifier circuit.

Certain embodiments relate to an amplifier linearization circuit assembly for reducing intermodulation distortion in a differential amplifier. The amplifier linearization circuit assembly comprises a difference frequency circuit configured to receive a first signal including a first frequency and a second frequency and to generate a second signal having a frequency approximately equal to the difference between the first frequency and the second frequency, an envelope generator configured to detect a power level of the first signal, and an envelope adjustor configured adjust a magnitude of the second signal based at least in part on the power level of the first signal to provide an adjusted signal. The amplifier linearization circuit assembly further comprises at least a first amplifier stage and a second amplifier stage configured as a differential amplifier. When received at an input terminal of the differential amplifier, the first signal generates first intermodulation products between the first and second frequencies in an output signal of the differential amplifier. The second amplifier stage is further configured not to receive the adjusted signal and the first amplifier stage is further configured to receive the adjusted signal to generate second intermodulation products with the first signal that cancel at least a portion of the first intermodulation products.

In an embodiment, the differential amplifier includes a power amplifier. In another embodiment, the differential amplifier includes a low noise amplifier. In a further embodiment, the first intermodulation products include third order intermodulation products of the first frequency and the second frequency. In a yet further embodiment, the first amplifier circuit includes one or more field effect transistors and the second signal is applied to a drain of the first amplifier circuit. In another embodiment, the first amplifier circuit includes one or more bipolar junction transistors and the second signal is applied to a collector of the first amplifier circuit. In a further embodiment, a wireless communication device comprises the amplifier linearization circuit assembly.

According to a number of embodiments, the disclosure relates to a wireless mobile device comprising an antenna configured to receive and transmit radio frequency (RF) signals, a transceiver configured to provide the antenna with RF signals for transmission and to receive from the antenna RF signals for processing, where the transceiver includes a first amplifier circuit and a second amplifier circuit that are configured as a differential amplifier to amplify an RF input signal that includes a first frequency component having a first frequency and a second frequency component having a second frequency. The differential amplifier includes an input configured to receive the radio frequency input signal and an output configured to provide an amplified radio frequency signal that includes first intermodulation products between the first and second frequency components. The wireless mobile device further comprises an apparatus including a difference frequency circuit configured to receive the radio frequency input signal and to generate a second signal having a frequency approximately equal to the difference between the first frequency and the second frequency, an envelope generator configured to detect a power level of the radio frequency input signal, and an envelope adjustor configured adjust an amplitude of the second signal based at least in part on the power level of the radio frequency input signal to provide an adjusted signal. The second amplifier stage is further configured not to receive the adjusted signal and the first amplifier stage is further configured to receive the adjusted signal to generate second intermodulation products with the first signal that cancel at least a portion of the first intermodulation products in the amplified radio frequency signal.

In an embodiment, the differential amplifier includes a power amplifier. In another embodiment, the differential amplifier includes a low noise amplifier. In a further embodiment, the first amplifier circuit includes one or more field effect transistors and the second signal is applied to a drain of the first amplifier circuit. In a further embodiment, the first amplifier circuit includes one or more bipolar junction transistors and the second signal is applied to a collector of the first amplifier circuit.

BRIEF DESCRIPTION OF THE DRAWINGS

FIG. 10 is a graph illustrating the dependence of the optimum envelope tracking voltage on the injection location for a cascade amplifier, according to certain embodiments.

DETAILED DESCRIPTION

In an embodiment, linearizers are electronic circuits, which improve the non-linear behavior of amplifiers to increase efficiency and maximum output power. These circuits counteract the non-linearities of the amplifier and minimize the distortion of the signal. This increases the linear operating range up to the saturation (maximum output power) of the amplifier. Linearized amplifiers have a significantly higher efficiency with improved signal quality. Techniques to avoid the undesired effects of intermodulation distortion include feedforward, feedback, predistortion, digital predistortion, and postdistortion linearization. Embodiments disclosed herein provide significant improvement in amplifier linearization with simpler circuitry.

Intermodulation distortion (IMD) is the amplitude modulation of signals containing two or more different frequencies in a system with nonlinearities. The intermodulation between each frequency component will form additional signals at frequencies that are not just at harmonic frequencies (integer multiples) of either, like harmonic distortion, but also at the sum and difference frequencies of the original frequencies and at multiples of those sum and difference frequencies.

When a signal comprising two different frequencies is input (or injected) into the gate or base of the transistor, the intermodulation distortion generated between the two frequencies is defined as gate-to-gate intermodulation distortion (G-G IMD).

When a signal comprising a single frequency is input (or injected) into the gate or base and a signal comprising a different single frequency is input (or injected) into the drain or collector of the transistor, the intermodulation distortion generated between the two frequencies is defined as gate-to-drain intermodulation distortion (G-D IMD).

In an embodiment, when the frequency of the drain-injected signal is equal or approximately equal to the difference frequency of the gate-injected two-frequency signal, the frequency of at least a portion of the gate-to-gate intermodulation distortion is approximately the same as that of the gate-to-drain intermodulation distortion. Further, the gate-to-gate intermodulation distortion and the gate-to-drain intermodulation distortion are intrinsically in opposite phase for both FETs and BJTs. The magnitude of the gate-to-drain intermodulation distortion can be adjusted independently, or in other words, without changing the magnitude of the gate-to-gate intermodulation distortion. In an embodiment, improved linearization can be achieved controlling the magnitude and frequency of the gate-to-drain intermodulation distortion to cancel the gate-to-gate intermodulation distortion. This intermodulation distortion cancellation can be applied to multi-tone or n-tone signals, where n≥2.

FIGS. 1-5 illustrate embodiments of gate-to-gate intermodulation distortion and gate-to-drain intermodulation distortion cancellation for improved amplifier linearization.

Figure 1:
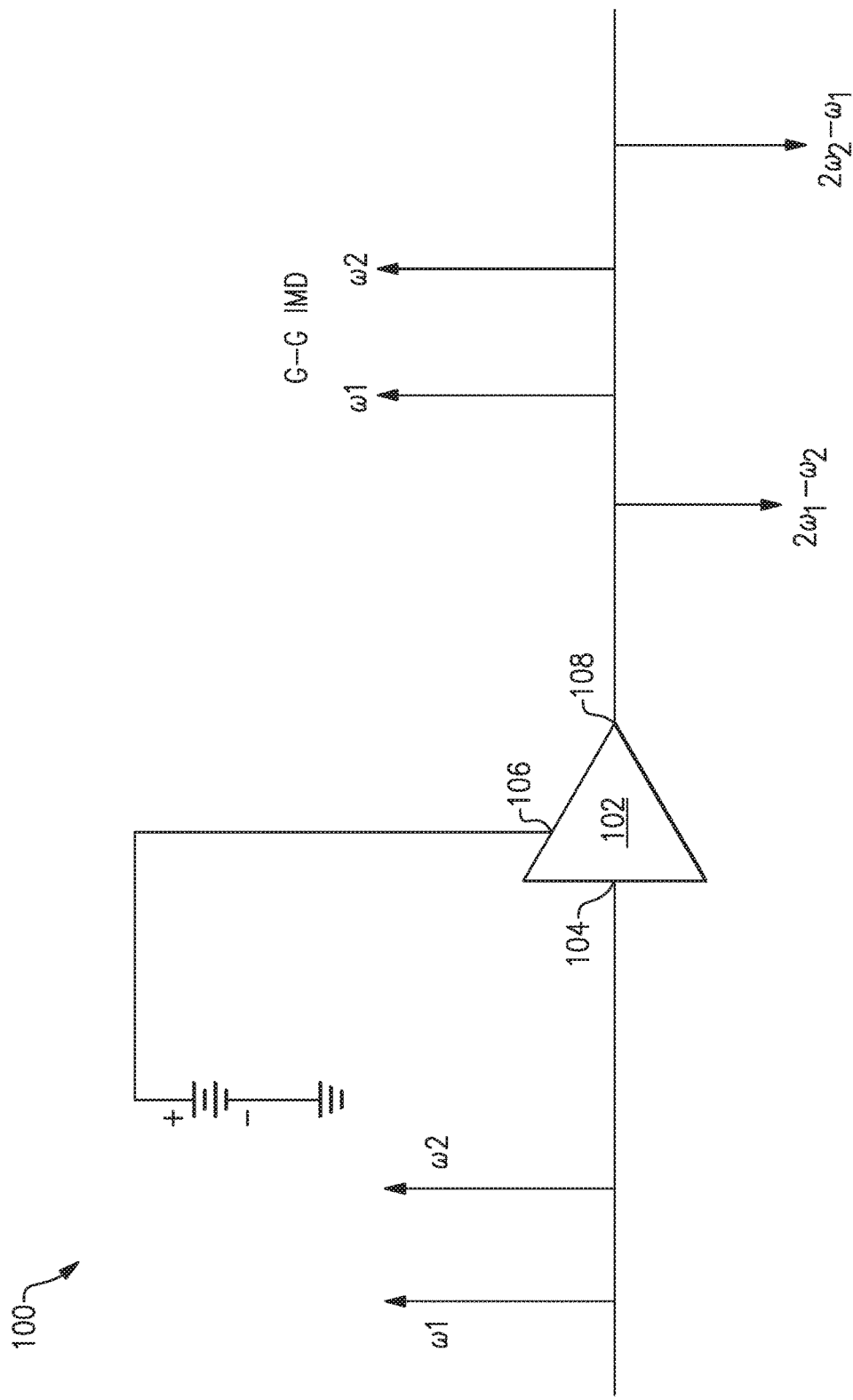
FIG. 1 is a schematic diagram illustrating gate-to-gate intermodulation distortion, according to certain embodiments.

FIG. 1 is a schematic diagram 100 illustrating gate-to-gate intermodulation distortion (G-G IMD) for an amplifier 102 having a first terminal 104, a second terminal 106, and a third terminal 108. An input signal is received at the first or input terminal 104 and an output signal is output at the third or output terminal 108. The amplifier 102 comprises one or more transistors. In an embodiment, the transistors comprise field effect transistors (FETs) and the first terminal 104 comprises a gate of the FET, the second terminal 106 comprises a DC access of a drain of the FET, and the third terminal 108 comprises a radio frequency (RF) access of the drain (the source) of the FET. In another embodiment, the transistors comprise bipolar junction transistors (BJTs), and the first terminal 104 comprises a base of the BJT, the second terminal 106 comprises a DC access of a collector of the BJT, and the third terminal 108 comprises an RF access of the collector (the emitter) of the BJT. For simplicity, throughout the disclosure, the gate or base will be referred to as the gate, the drain or collector will be referred to as the drain, and the source or emitter will be referred to as the source.

A two-tone signal having a first fundamental frequency $\omega_1$ and a second fundamental frequency $\omega_2$ is input into the amplifier 102 at the gate terminal 104 and the drain terminal 106 is electrically coupled to a DC voltage, Vdc. The amplifier 102 amplifies the input signal and outputs at the output terminal 108 a signal comprising an amplified first fundamental frequency $\omega_1$ and an amplified second fundamental frequency $\omega_2$. Due to the non-linear nature, the amplifier 102 mixes $\omega_1$ and $\omega_2$. Mixing of $\omega_1$ and $\omega_2$ results in intermodulation products having frequencies of, for example ($\pm\omega_1\pm\omega_2$), ($\pm\omega_1\pm2\omega_2$), ($\pm2\omega_1\pm\omega_2$), ($\pm2\omega_1\pm2\omega_2$), ..., ($\pm m\omega_1\pm n\omega_2$). Many of the intermodulation products can be filtered from the output signal. However, as illustrated in FIG. 1, the third order intermodulation products, $2\omega_1-\omega_2$ and $2\omega_2-\omega_1$, are close to the fundamental frequencies, $\omega_1$ and $\omega_2$, and are difficult to remove from the output signal by filtering.

Figure 2:
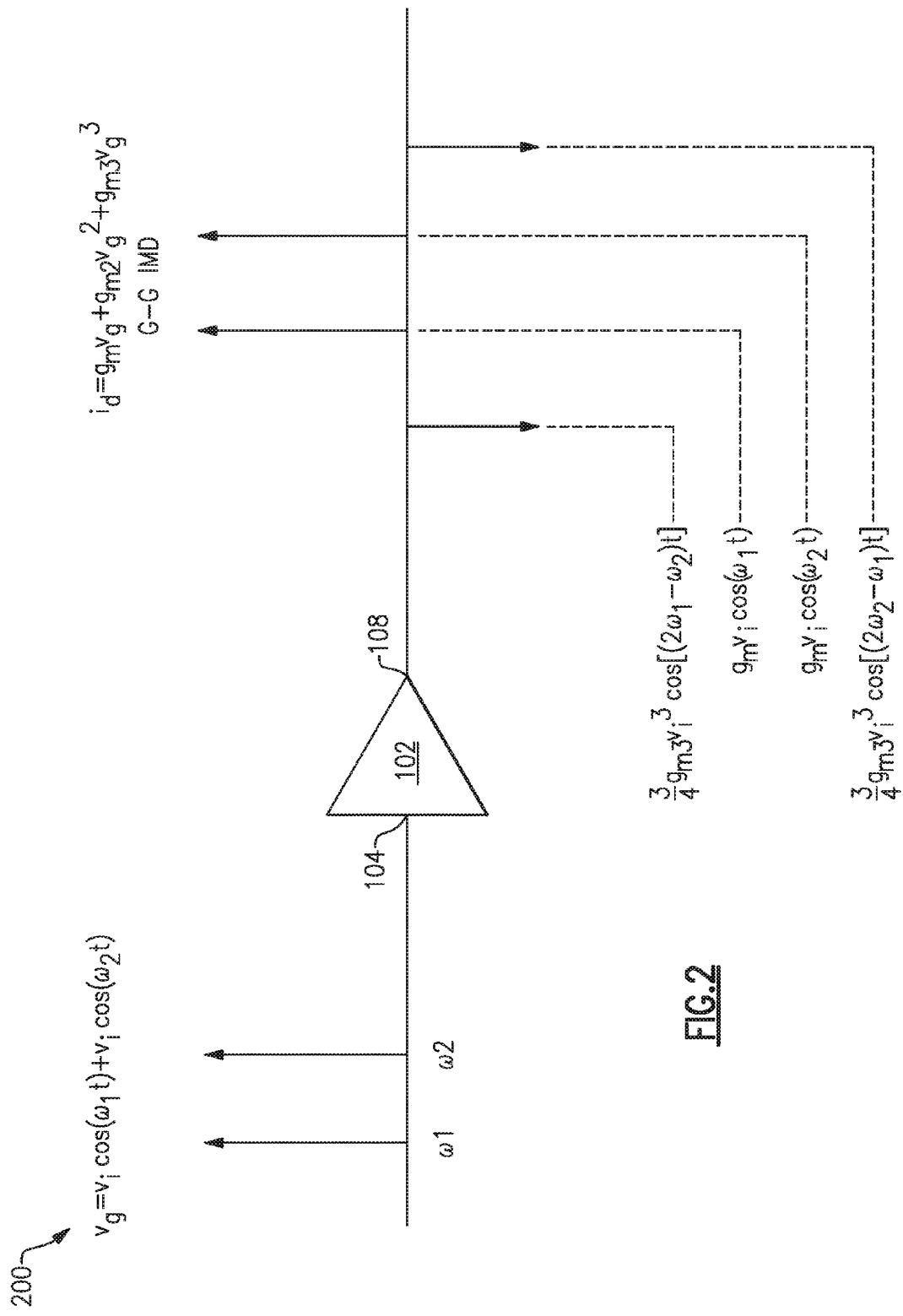
FIG. 2 is a schematic diagram illustrating the amplitude and phase of gate-to-gate intermodulation distortion, according to certain embodiments

FIG. 2 is a schematic diagram 200 illustrating the amplitude and phase of the gate-to-gate intermodulation (G-G IMD) for the amplifier 102. A gate voltage signal, $v_g=v_i \cos(\omega_1 t)+v_i \cos(\omega_2 t)$, is received at the input to the amplifier 102 and a drain current signal, $i_d=g_m v_g+g_{m2} v_g^2+g_{m3} v_g^3$, is output from the amplifier 102. The fundamental frequency components of the output signal are:
$g_m v_i \cos(\omega_1 t)$; and
$g_m v_i \cos(\omega_2 t)$.
The third order intermodulation components of the output signal are:

$$\frac{3}{4} g_{m3} v_i^3 \cos[(2\omega_1-\omega_2)t]; \text{ and}$$

$$\frac{3}{4} g_{m3} v_i^3 \cos[(2\omega_2-\omega_1)t].$$

where $g_m$ is the transconductance of the amplifier, $g_{m3}$ is the second derivative of $g_m$, and $v_i$ is the amplitude of the input signal. Transconductance is the ratio of the change in drain current to the change in gate voltage over a defined, arbitrarily small interval on the drain-current-versus-gate-voltage curve.

When the functional relationship between the gate voltage and the drain current is known, the transconductance $g_m$ is the first derivative of $i_d$ versus $v_g$, and $g_{m3}$ is the third derivative of $i_d$ versus $v_g$, or the second derivative of $g_m$ versus $v_g$. When the functional relationship is not known, the drain current at various gate voltages can be measured and transconductance can be calculated.

Figure 3:
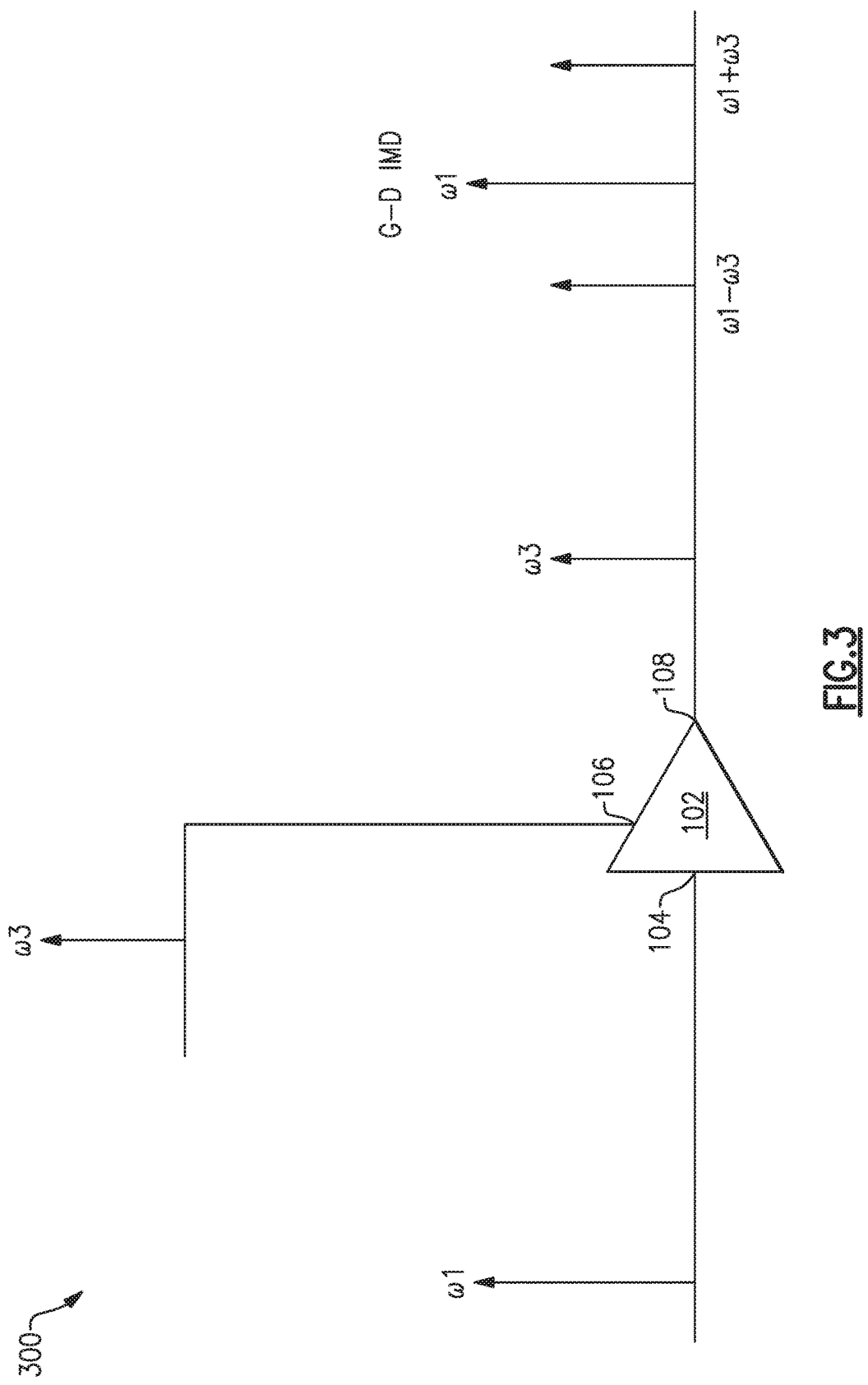
FIG. 3 is a schematic diagram illustrating gate-to-drain intermodulation, according to certain embodiments.

FIG. 3 is a schematic diagram 300 illustrating gate-to-drain intermodulation (G-D IMD) for the amplifier 102. In an embodiment, a first signal having the first fundamental frequency $\omega_1$ is received at the gate terminal 104 of the amplifier 102. A second signal having a third frequency $\omega_3$ is received at the drain terminal 106 of the amplifier 102. The amplifier 102 outputs at the output terminal 106 a signal comprising an amplified first fundamental frequency $\omega_1$ and the third frequency $\omega_3$.

Again, due to the non-linear system, the amplifier 102 mixes the first and third frequencies and outputs intermodulation products. The intermodulation products, $\omega_1-\omega_3$ and $\omega_1+\omega_3$, can be used to cancel at least a portion of the third order intermodulation products of the first and second fundamental frequencies, $2\omega_1-\omega_2$ and $2\omega_2-\omega_1$.

Figure 4:
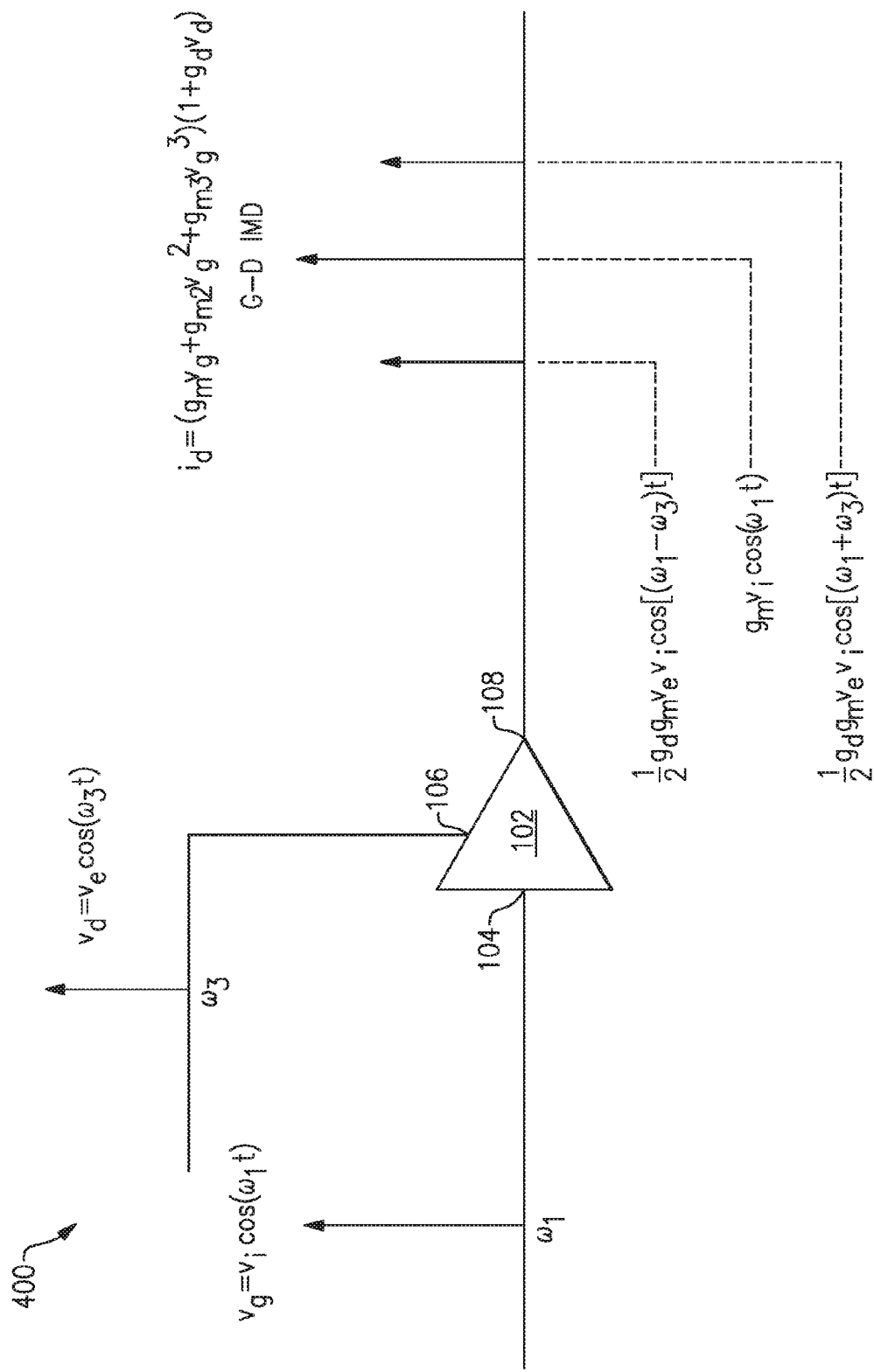
FIG. 4 is a schematic diagram illustrating the amplitude and phase of the gate-to-drain intermodulation distortion, according to certain embodiments.

FIG. 4 is a schematic diagram 400 illustrating the amplitude and phase of the gate-to-drain intermodulation distortion (G-D IMD) for the amplifier 102. A gate voltage input signal, $v_g=v_i \cos(\omega_1 t)$, is received at the gate terminal 104 of the amplifier 102 and a drain voltage signal, $v_d=v_e \cos(\omega_3 t)$, is received at the drain terminal 106. A drain current signal, $i_d=(g_m v_g+g_{m2} v_g^2+g_{m3} v_g^3)(1+g_d v_d)$, is output from the amplifier 102. The fundamental frequency component of the output signal is:
$g_m v_i \cos(\omega_1 t)$.
The second order components of the output signal are:

$$\frac{1}{2} g_d g_m v_e v_i \cos[(\omega_1-\omega_3)t]; \text{ and}$$

$$\frac{1}{2} g_d g_m v_e v_i \cos[(\omega_1+\omega_3)t].$$

where $g_m$ is the transconductance of the fundamental frequency component in the output signal, $g_d$ is the output conductance, $v_i$ is the amplitude of the gate signal, and $v_e$ is the amplitude of the drain signal. The transconductance $g_m$ of the fundamental frequency component in the output signal is positive, as well as the output conductance $g_d$.

Figure 5:
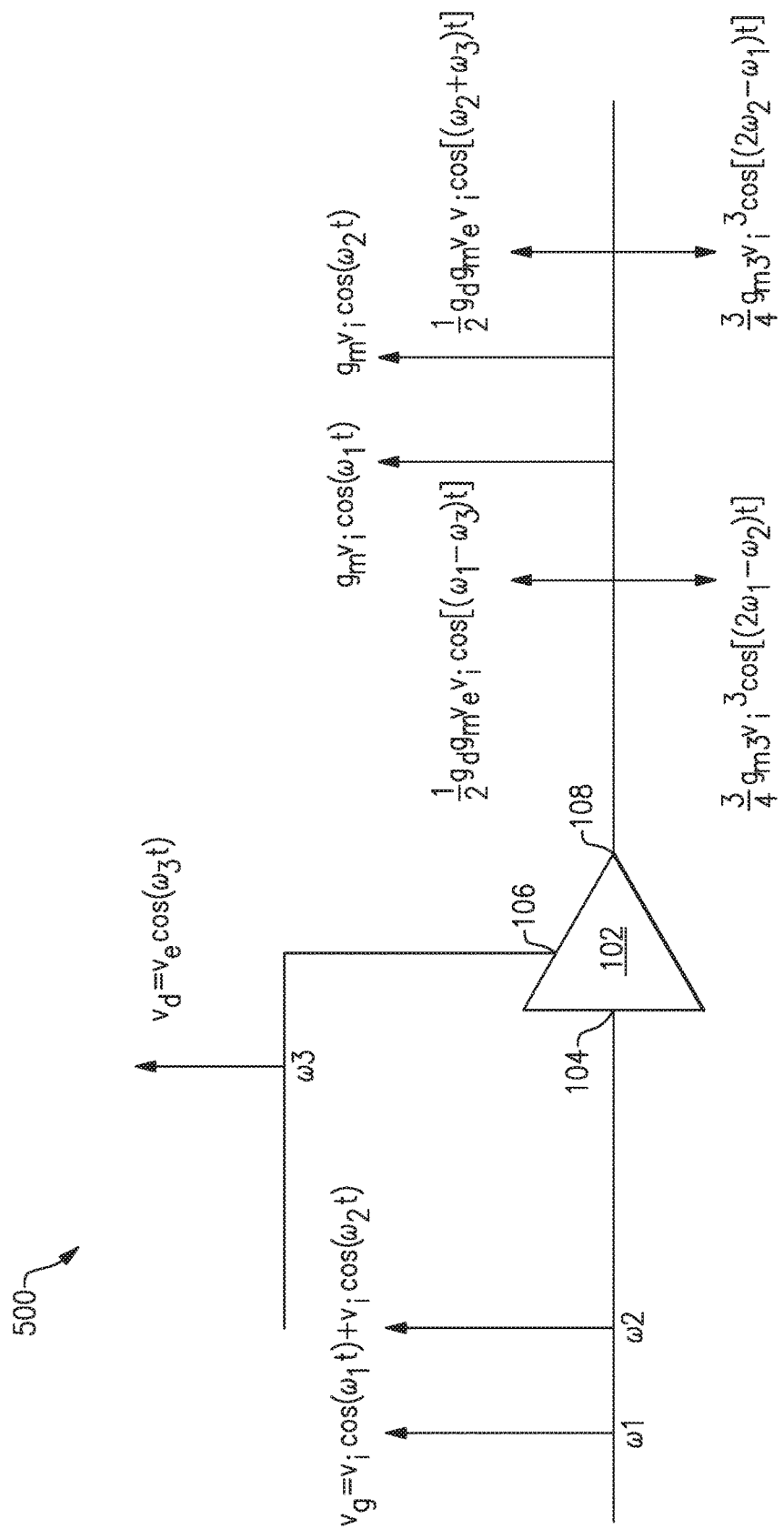
FIG. 5 is a schematic diagram illustrating the overlap of the amplitude and phase of the gate-to-gate intermodulation distortion and gate-to-drain intermodulation distortion, according to certain embodiments.
Figure 6:
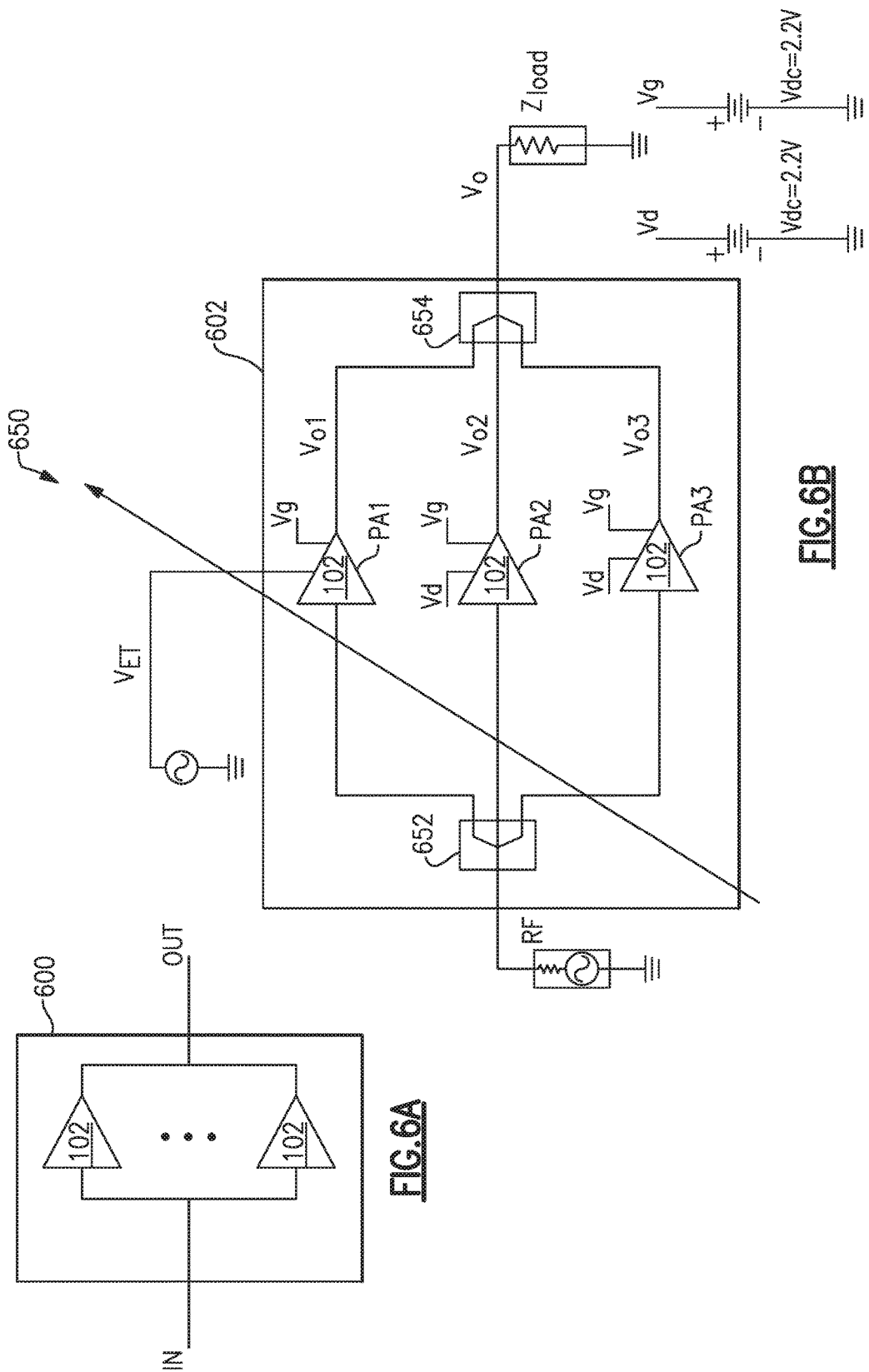
FIG. 6A is a schematic diagram illustrating a multistage parallel amplifier, according to certain embodiments.
FIG. 6B is a schematic diagram illustrating a 3-tone harmonic balance simulation for a three-stage parallel amplifier, according to certain embodiments.
Figure 7:
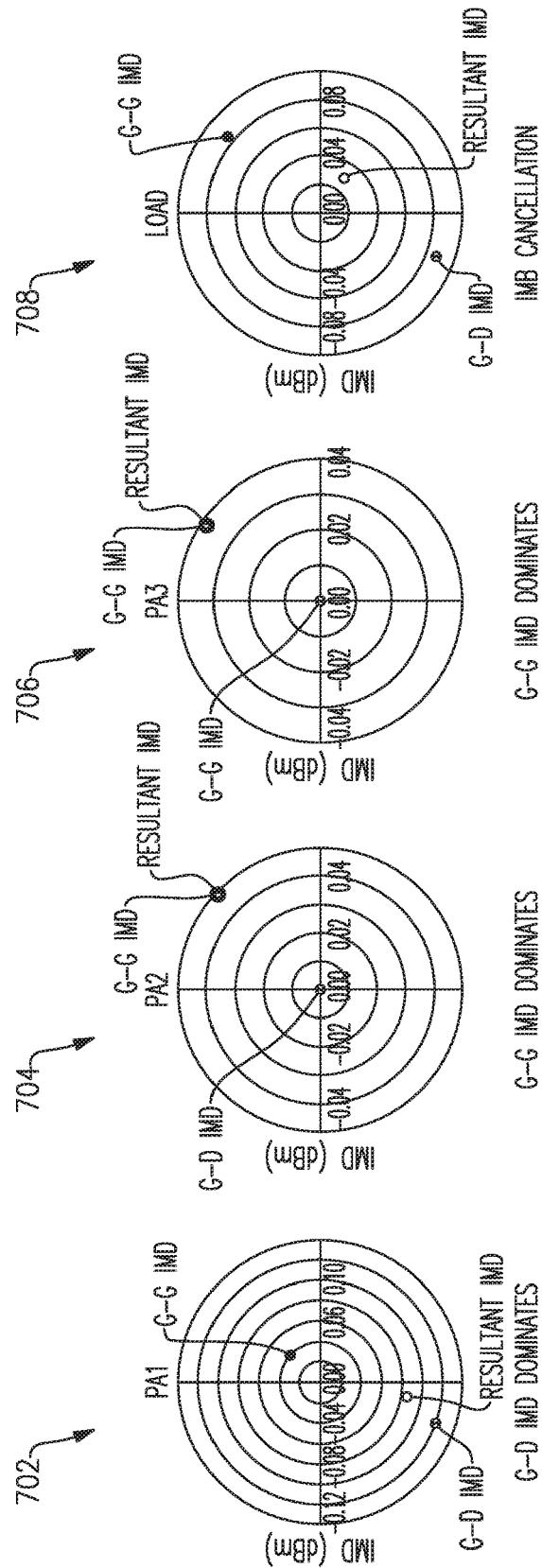
FIGS. 7A-7D are polar plots illustrating the gate-to-gate intermodulation distortion, the gate-to-drain intermodulation distortion, and the resultant intermodulation distortion for the 3-tone harmonic balance simulation of FIG. 6B, according to certain embodiments.

FIG. 5 is a schematic diagram 500 illustrating the amplitude and phase of the G-G IMD and the G-D IMD for the amplifier 102. The two-tone signal having the first fundamental frequency $\omega_1$ and the second fundamental frequency $\omega_2$ is received at the gate terminal 104 of the amplifier 102 and the signal having the third frequency $\omega_3$ is received at the drain terminal 106 of the amplifier 102. The amplifier 102 outputs at the output terminal 108 a signal comprising an amplified first fundamental frequency $\omega_1$, an amplified second frequency $\omega_2$, G-G IMD products $2\omega_1-\omega_2$ and $2\omega_2-\omega_1$, and G-D IMD products $\omega_1-\omega_3$ and $\omega_2+\omega_3$. The spectrums of G-G IMD and G-D IMD overlap when $\omega_3=\omega_2-\omega_1$ or $\omega_3\approx\omega_2-\omega_1$, and at least a portion of the G-G IMD can be canceled by the G-D IMD due to the overlap.

A gate voltage input signal, $v_g = v_i \cos(\omega_1 t) + v_i \cos(\omega_2 t)$, is received at the gate terminal 104 of the amplifier 102 and a drain voltage signal, $v_d = V_e \cos(\omega_3 t)$, is received at the drain terminal 106. A drain current signal, $i_d = (g_m v_g + g_{m2} v_g^2 + g_{m3} v_g^3)(1 + g_d v_d)$ is output from the amplifier 102. The fundamental frequency components of the output signal are:

$g_m v_i \cos(\omega_1 t)$; and
$g_m v_i \cos(\omega_2 t)$.

The third order G-G IMD components of the output signal are:

$$\frac{3}{4} g_{m3} v_i^3 \cos[(2\omega_1 - \omega_2)t]; \text{ and}$$

$$\frac{3}{4} g_{m3} v_i^3 \cos[(2\omega_2 - \omega_1)t].$$

The second order G-D IMD components of the output signal are:

$$\frac{1}{2} g_d g_m v_e v_i \cos[(\omega_1 - \omega_3)t]; \text{ and}$$

$$\frac{1}{2} g_d g_m v_e v_i \cos[(\omega_2 + \omega_3)t].$$

The spectrums of the G-G IMD and the G-D IMD overlap when $\omega_3 = \omega_2 - \omega_1$ or $\omega_3 \approx \omega_2 - \omega_1$, and at least some cancellation occurs when $g_d > 0$, $g_m > 0$, and $g_{m3} < 0$, as represented below:

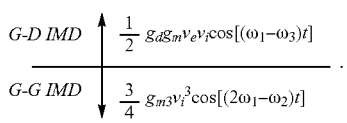

G-G IMD and G-D IMD are opposite in phase with respect to the fundamental frequency. Cancellation occurs when $$\frac{2 g_d g_m v_e}{3 g_{m3} v_i^2} = -1.$$

The amplitude of G-D IMD can be adjusted by controlling the envelope voltage $V_e$ of the $\omega_3$ signal without substantially changing the amplitude of the G-G IMD.

For the single-stage amplifier 102, as shown in FIGS. 1-5, the intermodulation distortion can be significantly reduced by applying or injecting a difference frequency to the drain terminal 106 of the amplifier 102. In these embodiments, the G-G IMD and G-D IMD cancellation occurs within the amplifier 102.

In some systems, a single transistor or single-stage amplifier does not provide sufficient gain or bandwidth or will not have the correct input or output impedance matching. One solution is to combine multiple stages of amplification. Compared to single-stage amplifiers, multistage amplifiers provide increased input resistance, reduced output resistance, increased gain, and increased power-handling capability. Multistage amplifiers are commonly implemented on integrated circuits where large numbers of transistors with common (matched) parameters are available.

The G-G IMD and G-D IMD cancellation can also be applied to combination or multistage amplifiers to improve the linearity of multistage amplifiers. In an embodiment, the intermodulation distortion at the output of a multistage amplifier can be reduced by applying or injecting the difference frequency at each amplifier comprising an amplifier stage of the multistage amplifier.

In other embodiments, the intermodulation distortion at the output of a multistage amplifier can be reduced by applying or injecting the difference frequency at one or at some, but not all, of the amplifiers of the multistage amplifier. In these embodiments, the G-G IMD and G-D IMD cancellation occurs at the load. In other words, each amplifier of each amplifier stage is nonlinear individually and improved linearization of the multistage amplifier occurs because of IMD cancellation between the amplifier stages. As described above, the amplitude of G-D IMD can be adjusted by controlling the envelope voltage $V_e$ of the difference frequency signal that is applied to the drain terminal of the amplifier.

Applying the difference frequency signal as an envelope tracking bias voltage or envelope tracking voltage $V_{ET}$ to one or some of the amplifiers in a multistage amplifier advantageously simplifies the circuitry and reduces the cost of improved amplifier linearity. FIGS. 6-14 illustrate G-G IMD and G-D IMD cancellation for embodiments of combination or multistage amplifiers.

FIG. 6A is a schematic diagram illustrating a multistage amplifier 600 comprising 2-to-N amplifiers 102 configured in parallel to form an N-stage parallel amplifier.

FIG. 6B is a schematic diagram illustrating a 3-tone harmonic balance simulation 650 for an embodiment of the multistage amplifier 600. In FIG. 6B, the multistage amplifier comprises three amplifiers 102 configured in parallel to form a three-stage parallel amplifier 602. In an embodiment, the amplifiers 102 comprise power amplifiers (PAs) and are indicated as PA1, PA2, and PA3. In other embodiments, the amplifiers 102 comprise low noise amplifiers (LNAs).

The envelope tracking voltage $V_{ET}$ can be injected at each amplifier PA1, PA2, and PA3, at one amplifier PA1, PA2, or PA3, or at some (any two) amplifiers PA1, PA2, and PA3. During the 3-tone harmonic balance simulation 650, the envelope tracking voltage $V_{ET}$ is injected at the drain terminal of amplifier PA1. The amplitude of the drain signal is swept.

In an embodiment, the simulation includes three orders of intermodulation distortion. Fundamental frequencies $\omega_1$ and $\omega_2$ are received at the input gates 104 of the amplifiers PA1, PA2, PA3 via a first power splitter 652. The envelope tracking voltage $V_{ET}$, comprising the difference frequency $\omega_3$ and a DC offset voltage Voffset, is received at the drain terminal 106 of the amplifier PA1. Drain terminals 106 of amplifiers PA2 and PA3 receive DC Vd. Amplifiers PA1, PA2, and PA3 are biased with a DC bias voltage Vg. Outputs Vo1, Vo2, and Vo3 of amplifiers PA1, PA2, and PA3, respectively, are combined via a second power splitter 654. An output Vo of the three parallel amplifier 602 is terminated with a termination load Zload. In an exemplary simulation, the simulation parameters comprise:

$\omega_1 = 1.9975$ GHz;
$\omega_2 = 2.0025$ GHz;
$\omega_3 = 5$ MHz;
Voffset = 2.5V;
RF signal power = 4.77 dBm;
Zload = 50 Ohms;
Vd = 2.2V; and
Vg = 2.2V.

FIGS. 7A-7D are polar plots for the 3-tone harmonic balance simulation of FIG. 6B. FIG. 7A is a polar plot 702 illustrating the gate-to-gate intermodulation distortion, the gate-to-drain intermodulation distortion, and the resultant intermodulation distortion for amplifier PA1. Since the envelope tracking voltage $V_{ET}$ was injected at the drain terminal of PA1, the resultant intermodulation for amplifier PA1 is dominated by the gate-to-drain intermodulation.

FIG. 7B is a polar plot 704 illustrating the gate-to-gate intermodulation distortion, the gate-to-drain intermodulation distortion, and the resultant intermodulation distortion for amplifier PA2. Since no envelope tracking voltage $V_{ET}$ was injected at the drain terminal of amplifier PA2, the gate-to-drain intermodulation distortion is approximately zero and the gate-to-gate intermodulation distortion dominates the resultant intermodulation distortion.

FIG. 7C is a polar plot 706 illustrating the gate-to-gate intermodulation distortion, the gate-to-drain intermodulation distortion, and the resultant intermodulation distortion for amplifier PA3. Since no envelope tracking voltage $V_{ET}$ was injected at the drain terminal of amplifier PA3, the gate-to-drain intermodulation distortion is approximately zero and the gate-to-gate intermodulation distortion dominates the resultant intermodulation distortion.

FIG. 7D is a polar plot 708 illustrating the gate-to-gate intermodulation distortion, the gate-to-drain intermodulation distortion, and the resultant intermodulation distortion in dBm for the three-stage parallel amplifier 602 of FIG. 6B. The gate-to-gate intermodulation distortion, the gate-to-drain intermodulation distortion, and the resultant intermodulation distortion for the three-stage parallel amplifier 602 are measured at the load Zload. Each amplifier PA1, PA2, and PA3 is non-linear, but when amplifiers PA1, PA2, and PA3 each pass power to the load Zload, the power is additive. The sum of the gate-to-gate intermodulation distortion and the gate-to-drain intermodulation distortion from amplifiers PA1, PA2, and PA3 provide cancellation of at least a portion of the third order intermodulation distortion.

As illustrated in FIG. 7D, G-G IMD is approximately 0.08 dBm, the G-D IMD is approximately 0.09 dBm and approximately opposite in phase from the G-G IMD, and the resultant IMD is approximately 0.01 dBm. Thus, adding the gate-to-gate intermodulation distortion and the gate-to-drain intermodulation distortion from amplifiers PA1, PA2, and PA3 produces a small resultant intermodulation distortion for the three-stage parallel amplifier 602.

Figure 8:
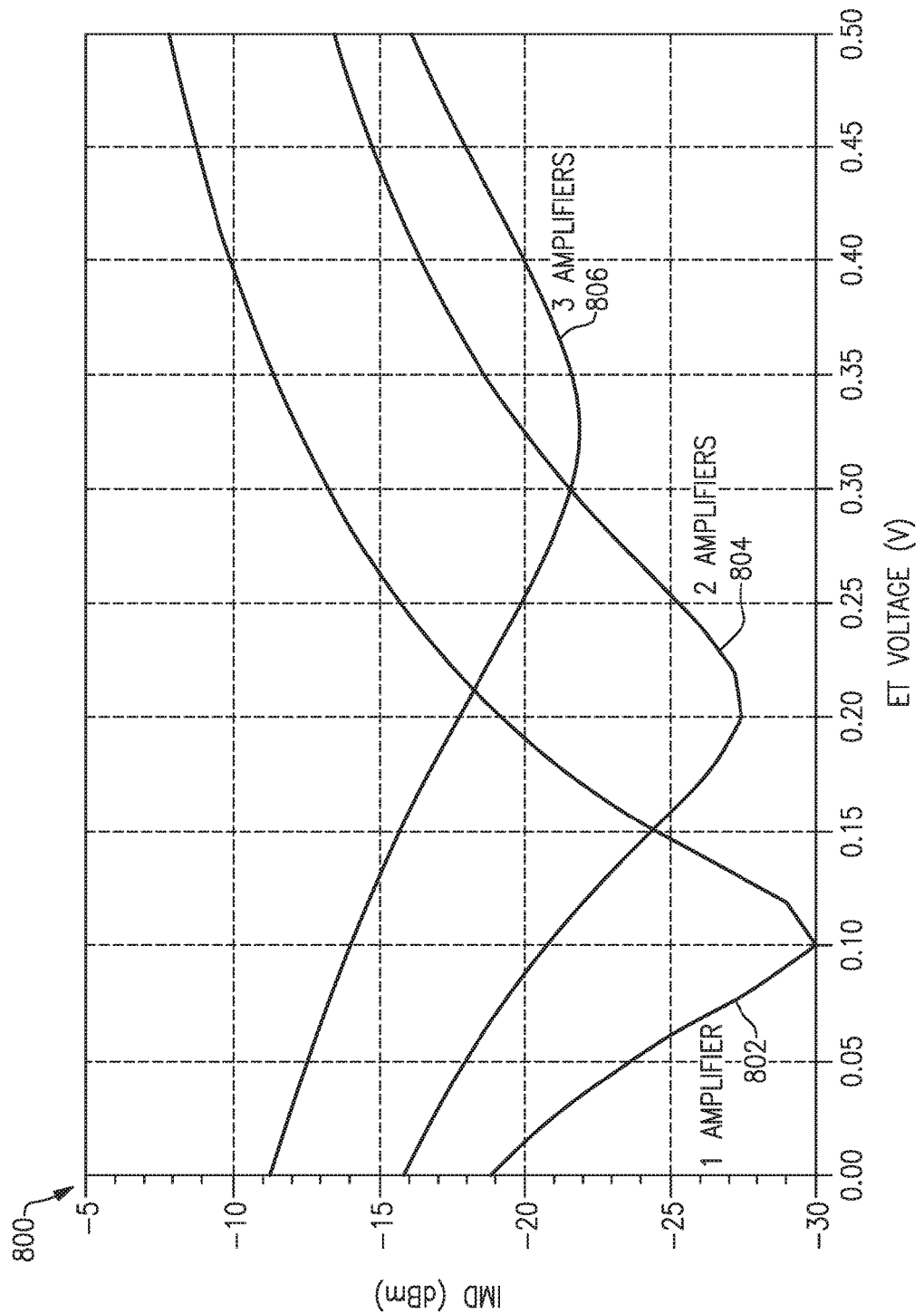
FIG. 8 is a graph illustrating the dependence of the optimum envelope tracking voltage for minimum intermodulation distortion on the number of parallel amplifier stages, according to certain embodiments.

FIG. 8 is a graph 800 illustrating the dependence of the optimum envelope voltage $V_{ET}$ corresponding to minimum intermodulation distortion on the number of parallel amplifier stages. The y-axis indicates intermodulation distortion in dBm and the x-axis indicates the envelope tracking voltage $V_{ET}$ in volts.

Trace 802 illustrates the intermodulation distortion versus the envelope tracking voltage $V_{ET}$ for a single amplifier. In the illustrated embodiment, the optimum envelope tracking voltage $V_{ET}$ is approximately 0.10 volts for the minimum intermodulation distortion of approximately −30 dBm.

Trace 804 illustrates the intermodulation distortion versus the envelope tracking voltage $V_{ET}$ for a two-stage parallel amplifier. In the illustrated embodiment, the optimum envelope tracking voltage $V_{ET}$ is approximately 0.20 volts for the minimum intermodulation distortion of approximately −27 dBm.

Trace 806 illustrates the intermodulation distortion versus the envelope tracking voltage $V_{ET}$ for a three-stage parallel amplifier. In the illustrated embodiment, the optimum envelope tracking voltage $V_{ET}$ is approximately 0.325 volts for the minimum intermodulation distortion of approximately −22 dBm.

Referring to traces 802, 804, and 806, the optimum envelope tracking voltage $V_{ET}$ increases as the number of stages in an N-stage parallel amplifier increases. Further, the intermodulation distortion increases as the number of stages in an N-stage parallel amplifiers increases.

Figure 9A:
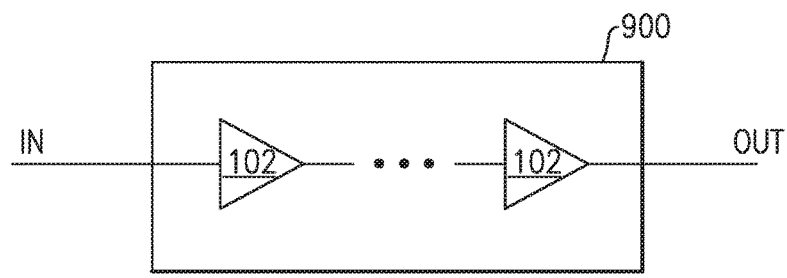
FIG. 9A is a schematic diagram illustrating a multistage cascade amplifier, according to certain embodiments.

FIG. 9A is a schematic diagram 900 illustrating a multistage amplifier 900 comprising 2-to-N amplifiers 102 configured in series (cascaded) to form an N-stage cascade amplifier.

Figure 9B:
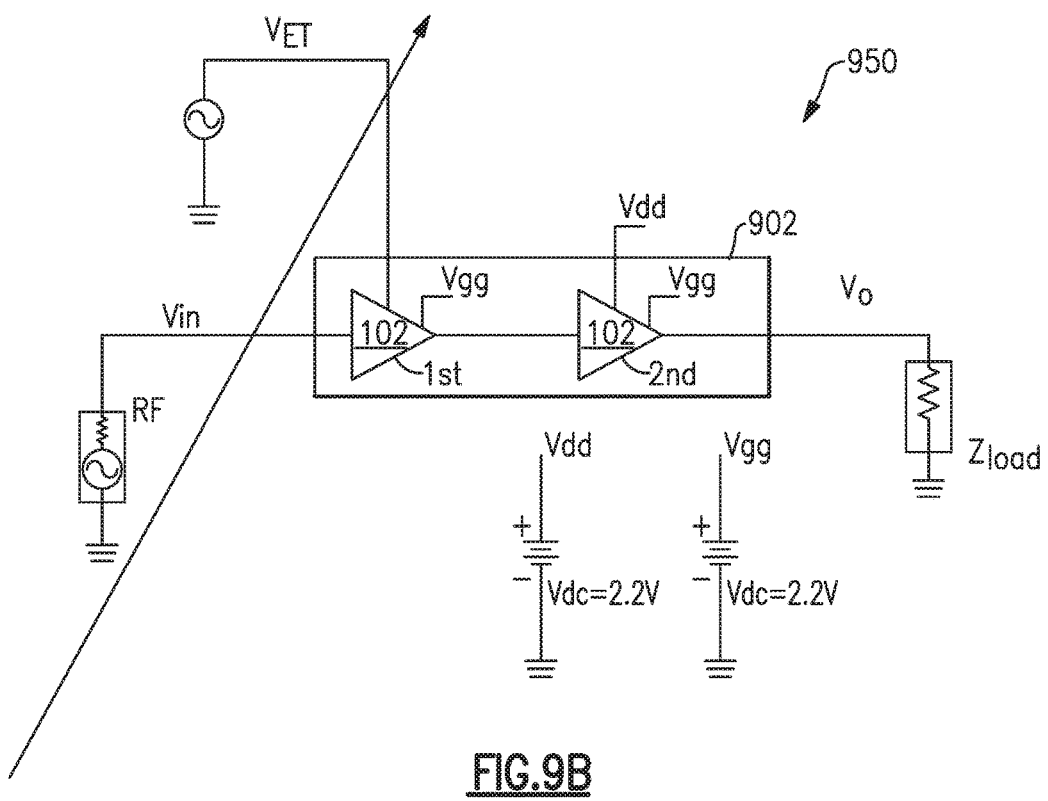
FIG. 9B is a schematic diagram illustrating a 3-tone harmonic balance simulation for a two-stage cascade amplifier, according to certain embodiments.

FIG. 9B is a schematic diagram illustrating a 3-tone harmonic balance simulation 950 for an embodiment of the multistage amplifier 900. In FIG. 9B, the multistage amplifier comprises a first amplifier and a second amplifier configured in series to form a two-stage cascade amplifier 902. In an embodiment, the first and second amplifiers comprise power amplifiers (PAs). In other embodiments, the first and second amplifiers comprise low noise amplifiers (LNAs).

The envelope tracking voltage can be injected at the first amplifier, at the second amplifier, or at both the first and second amplifiers. During the 3-tone harmonic balance simulation 950, the envelope tracking voltage is injected at the drain terminal of the first amplifier. The amplitude of the drain is swept.

In an embodiment, the simulation 950 includes three orders of intermodulation distortion. Fundamental frequencies ω1 and ω2 are received at the input gate 104 of the first amplifier. The input gate of the second amplifier receives the output of the first amplifier. The envelope tracking voltage $V_{ET}$, comprising the difference frequency ω3 and a DC offset voltage Voffset, is received at the drain terminal 106 of the first amplifier. The drain terminal 106 of the second amplifier receives DC Vdd. The first and second amplifiers are biased with a DC bias voltage Vgg. An output of the second amplifier forms an output Vo of the two-stage cascade amplifier 902. The output Vo of the two-stage cascade amplifier 902 is terminated with a termination load Zload. In an exemplary simulation, the simulation parameters comprise:

ω1=1.9975 GHz;
ω2=2.0025 GHz;
ω3=5 MHz;
Voffset=2.5V;
RF signal power=0 dBm;
Zload=50 Ohms;
Vdd=2.2V; and
Vgg=2.2V.

FIG. 10 is a graph 1000 illustrating the dependence of the optimum envelope tracking voltage $V_{ET}$ on the injection location of the envelope tracking voltage for a cascade amplifier. The optimum envelope tracking voltage can be defined as the envelope tracking voltage that minimizes the intermodulation distortion. The y-axis indicates intermodulation distortion in dBm and the x-axis indicates the envelope tracking voltage $V_{ET}$ in volts.

Trace 1002 illustrates the intermodulation distortion versus the envelope tracking voltage $V_{ET}$ for a two-stage cascade amplifier where the envelope tracking voltage $V_{ET}$ is injected at the drain terminal of the first amplifier. In the illustrated embodiment, the optimum envelope tracking voltage $V_{ET}$ is approximately 0.50 volts for the minimum intermodulation distortion of approximately −13 dBm.

Trace 1004 illustrates the intermodulation distortion versus the envelope tracking voltage $V_{ET}$ for the two-stage cascade amplifier where the envelope tracking voltage $V_{ET}$ is injected at the drain terminal of the second amplifier 102. In the illustrated embodiment, the optimum envelope tracking voltage $V_{ET}$ is approximately 0.70 volts for the minimum intermodulation distortion of approximately −23 dBm.

Referring to traces 1002 and 1004, the envelope tracking voltage $V_{ET}$ corresponding to the minimum intermodulation distortion increases as the envelope tracking voltage injection point is moved from the first amplifier to the second amplifier. In an embodiment, the optimum envelope tracking voltage $V_{ET}$ for the minimum intermodulation distortion increases as the envelope tracking voltage $V_{ET}$ is injected at later stages of an N-stage cascade amplifier.

For cascade amplifiers, the envelope tracking voltage can be injected at one, at some, or at all of the amplifier stages. In the example of the two-stage cascade amplifier 902, the envelope tracking voltage $V_{ET}$ can be injected at the drain terminal of the first amplifier, at the drain terminal of the second amplifier, or at the drain terminals of the first and second amplifiers.

The location in the cascade amplifier where the envelope tracking voltage $V_{ET}$ is applied affects the amplitude of the envelope tracking voltage to achieve the minimum intermodulation distortion at the output or load of the cascade amplifier. Table 1 illustrates the relationship between the optimum envelope tracking voltage and the injection location for the two-stage cascade amplifier 902. $V_{ET}1$ is the envelope tracking voltage injected at the first amplifier and $V_{ET}2$ is the envelope tracking voltage injected at the second amplifier.

TABLE 1

|  | $V_{ET}1$ (volts) | $V_{ET}2$ (volts) |
|---|---|---|
| Injection at first amplifier | 5.5 | 0.0 |
| Injection at second amplifier | 0.0 | 7.5 |
| Injection at both first and second amplifiers | 3.0 | 4.0 |

As illustrated in Table 1, a larger envelope tracking voltage minimizes the intermodulation distortion when the envelope tracking voltage is injected at the second amplifier than when it is injected at the first amplifier. It is possible that some intermodulation distortion is canceled when the envelope tracking voltage is injected at the first amplifier. The canceled distortion is not amplified by the second amplifier, so less envelope tracking voltage to minimize the intermodulation distortion of the cascade amplifier is needed when it is injected at the first amplifier.

When envelope tracking voltage $V_{ET}1$ is applied to the first amplifier and envelope tracking voltage $V_{ET}2$ is applied to the second amplifier at approximately the same time, the sum of the envelope tracking voltages ($V_{ET}1+V_{ET}2$) is less than the envelope tracking voltage $V_{ET}2$ that is applied to the second amplifier alone and greater than the envelope tracking voltage $V_{ET}1$ that is applied to the first amplifier alone to minimize the intermodulation distortion of the cascade amplifier.

Figure 11:
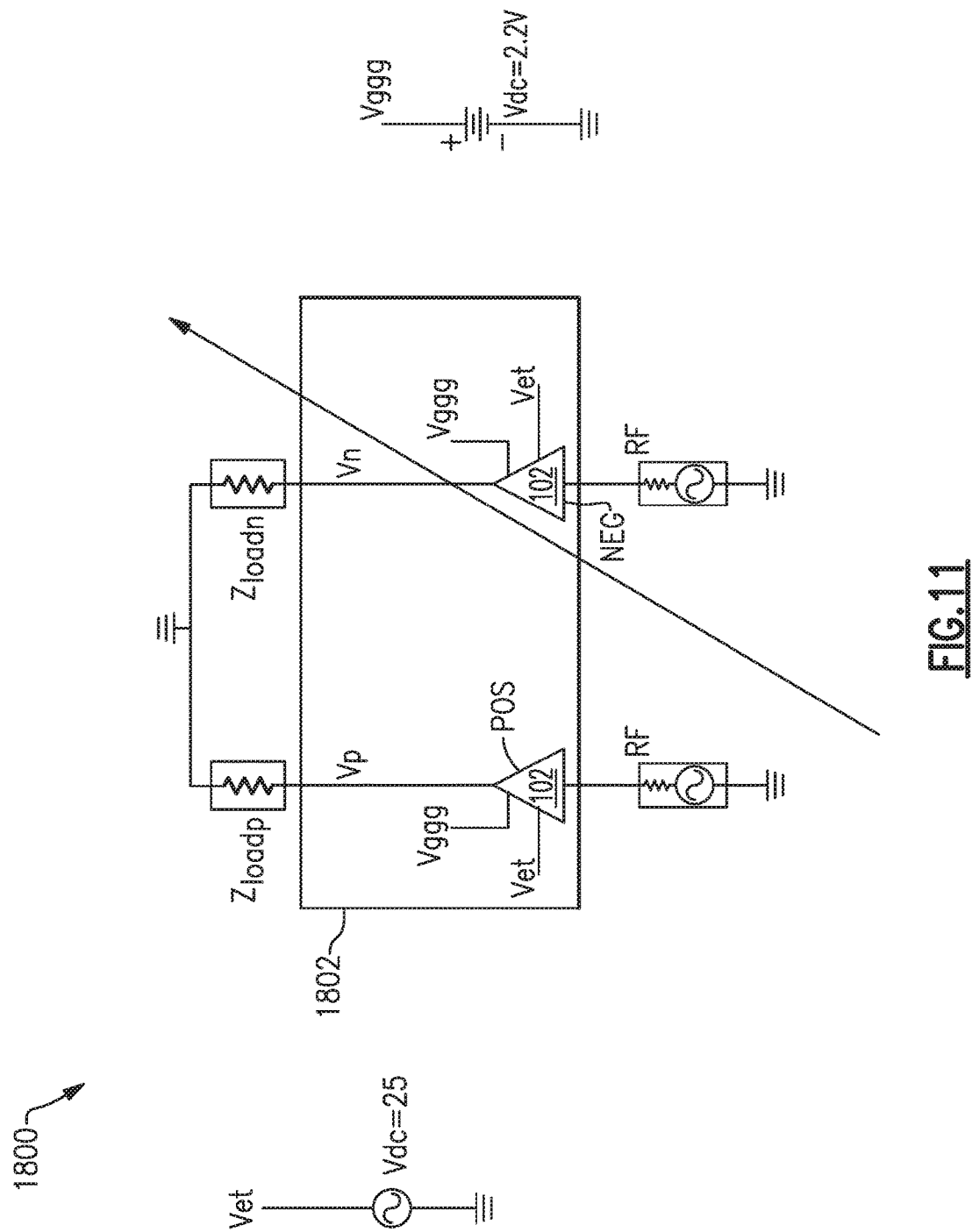
FIG. 11 is a schematic diagram illustrating a 3-tone harmonic balance simulation for a differential amplifier, according to certain embodiments.

FIG. 11 is a schematic diagram illustrating a 3-tone harmonic balance simulation 1800 for another embodiment of a combination amplifier. In FIG. 11, a combination amplifier comprises a first amplifier 102 and a second amplifier 102 where the first and second amplifiers 102 are configured as a differential amplifier 1802. The first amplifier 102 is operationally coupled to a positive input of the differential amplifier 1802 and referred to as the positive amplifier. The second amplifier 102 is operationally coupled to a negative input of the differential amplifier 1802 and referred to as the negative amplifier. In an embodiment, differential amplifier 1802 comprises a fully differential amplifier. In another embodiment, differential amplifier 1802 comprises an amplifier with opposite phase. In an embodiment, the differential amplifier 1802 comprises a power amplifier (PA). In another embodiment, the differential amplifier 1802 comprises a low noise amplifier (LNA).

The envelope tracking voltage $V_{ET}$ can be injected at the positive amplifier, at the negative amplifier, or at both the positive and negative amplifiers. During the 3-tone harmonic balance simulation 1800, the envelope tracking voltage $V_{ET}$ is injected at the drain terminals of both the positive and negative amplifiers. The amplitudes of the drain signals are swept.

In an embodiment, the simulation 1800 includes three orders of intermodulation distortion. Fundamental frequencies $\omega 1$ and $\omega 2$ are received at the input gates 104 of the positive and negative amplifiers. The envelope tracking voltage $V_{ET}$, comprising the difference frequency $\omega 3$ and a DC offset voltage Voffset, is received at the drain terminals 106 of the positive and negative amplifiers. The positive and negative amplifiers are biased with a DC bias voltage Vggg.

An output of the positive amplifier forms a positive output Vp of the differential amplifier 1802. The positive output Vp is terminated with a termination load Zloadp. An output from the negative amplifier 102 forms a negative output Vn of the differential amplifier 1802. The negative output Vn is terminated with a termination load Zloadn. In an exemplary simulation, the simulation parameters comprise:
$\omega 1$=1.9975 GHz;
$\omega 2$=2.0025 GHz;
$\omega 3$=5 MHz;
Voffset=2.5V;
RF signal power=0 dBm;
Zloadp=50 Ohms;
Zloadn=50 Ohms; and
Vggg=2.2V.

Figure 12B:
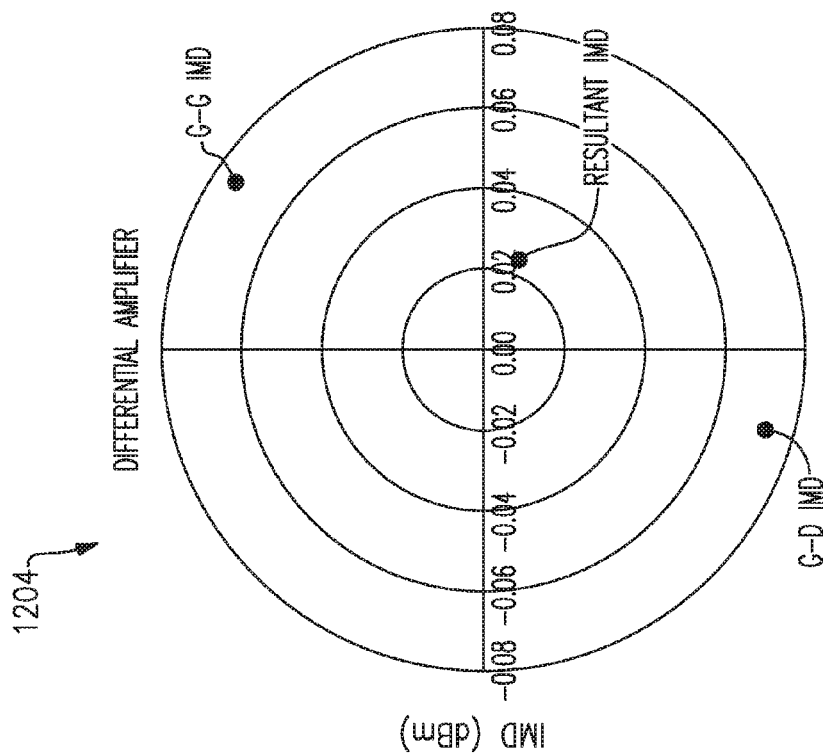
FIG. 12B is a polar plot illustrating the intermodulation distortion for the differential amplifier of FIG. 11, according to certain embodiments.
Figure 12A:
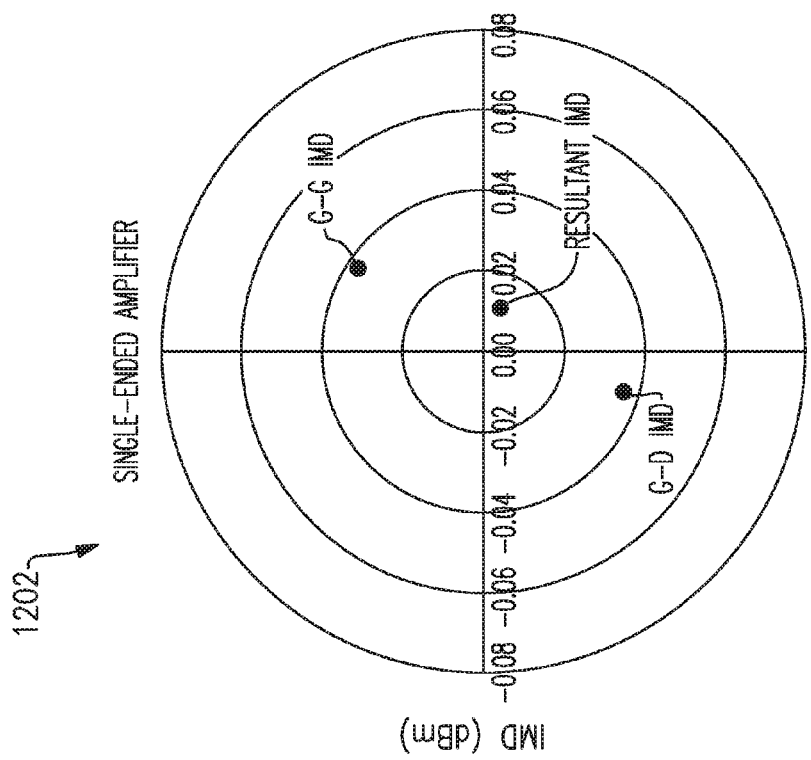
FIG. 12A is a polar plot illustrating the intermodulation distortion for each single-ended amplifier of the differential amplifier of FIG. 11, according to certain embodiments.

FIGS. 12A and 12B are polar plots for the 3-tone harmonic balance simulation of FIG. 11. FIG. 12A is a polar plot 1202 illustrating the gate-to-gate intermodulation distortion, the gate-to-drain intermodulation distortion, and the resultant intermodulation distortion for the positive and negative amplifiers of the differential amplifier 1802. The intermodulation distortion in dBm is measured at the output of each positive and negative amplifier.

Because the intermodulation distortion in polar plot 1202 is measured at the output of each positive and negative amplifier, it is referred to as the intermodulation distortion for a single-ended amplifier. Since each positive and negative amplifier is injected with approximately the same envelope tracking voltage $V_{ET}$, the gate-to-gate intermodulation distortion, the gate-to-drain intermodulation distortion, and the resultant intermodulation distortion are approximately the same for the positive amplifier and the negative amplifier.

In the illustrated embodiment, the gate-to-gate intermodulation distortion for the single-ended amplifier is approximately 0.04 dBm, the gate-to-drain intermodulation for the single-ended amplifier is approximately 0.035 dBm, and is approximately opposite in phase from the gate-to-gate intermodulation. The resultant intermodulation distortion is approximately 0.01 dBm. Thus, the resultant intermodulation distortion is much smaller than the gate-to-gate intermodulation distortion and the gate-to-drain intermodulation, indicating linearization improvement for both the positive and the negative amplifiers in the differential amplifier 1802.

FIG. 12B is a polar plot 1204 illustrating the gate-to-gate intermodulation distortion, the gate-to-drain intermodulation distortion, and the resultant intermodulation distortion for the differential amplifier 1802. The intermodulation distortion in dBm is measured at the load of the differential amplifier 1802. In the illustrated embodiment, the gate-to-gate intermodulation distortion for the differential amplifier 1802 is approximately 0.075 dBm, the gate-to-drain intermodulation for the differential amplifier 1802 is approximately 0.070 dBm, and is approximately opposite in phase from the gate-to-gate intermodulation. The resultant intermodulation distortion is approximately 0.03 dBm.

Referring to the polar plot 1204, the gate-to-gate intermodulation distortion for the differential amplifier 1802 comprises approximately the sum of the gate-to-gate intermodulation distortion for the positive amplifier and the gate-to-gate intermodulation distortion for the negative amplifier. Likewise, the gate-to-drain intermodulation distortion for the differential amplifier 1802 comprises approximately the sum of the gate-to-drain intermodulation distortion for the positive amplifier and the gate-to-drain intermodulation distortion for the negative amplifier. Further, the gate-to-gate intermodulation distortion and the gate-to-drain intermodulation distortion of the differential amplifier 1802 largely cancel one another to provide the resultant intermodulation distortion.

Polar plot 1202 illustrates that the injection of the envelope tracking voltage at each positive and negative amplifier improved linearization of each positive and negative amplifier, respectively, and polar plot 1204 illustrates that the combination of the positive amplifier and the negative amplifier to form the differential amplifier 1802 also exhibits the improved linearization.

Figure 13:
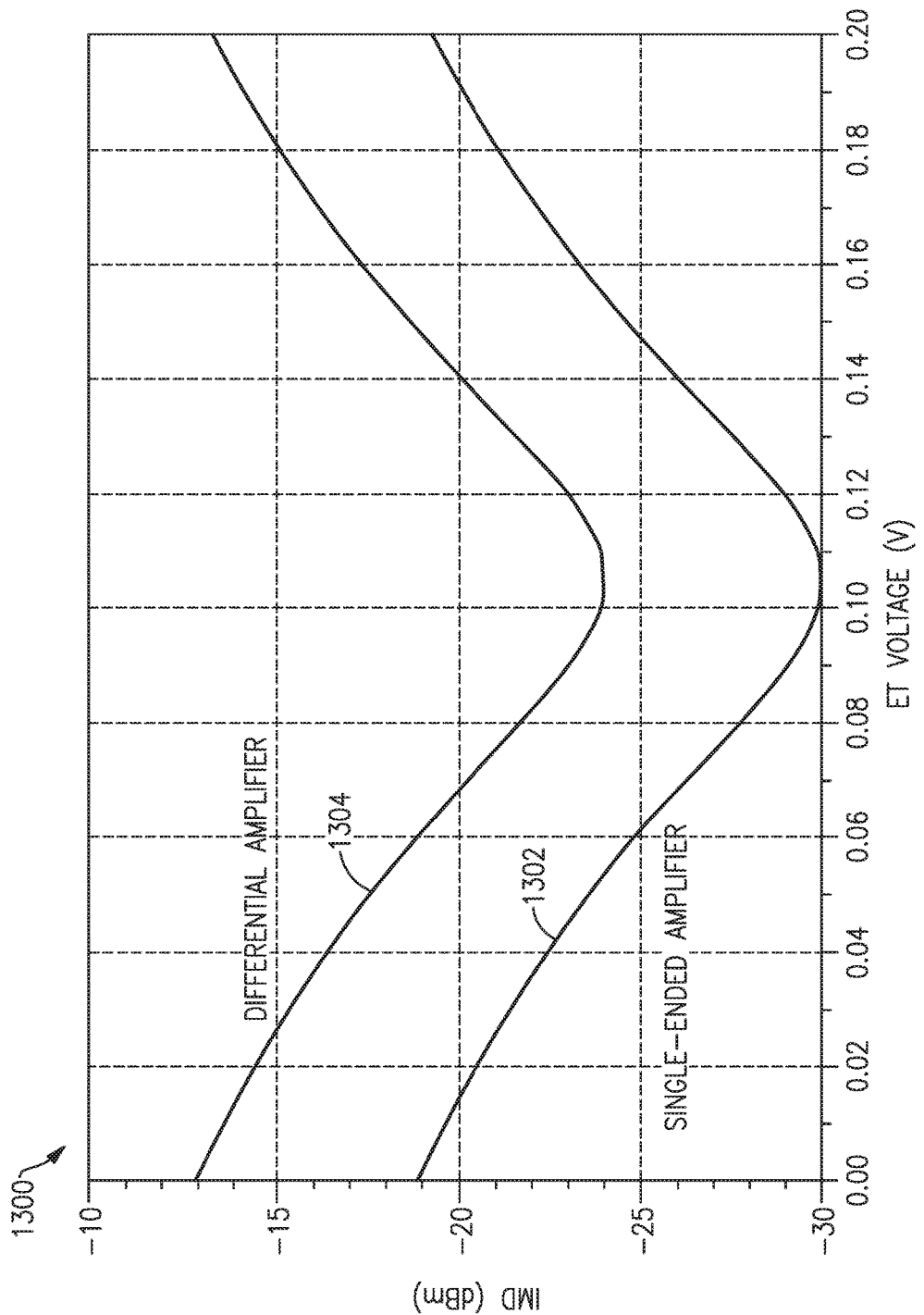
FIG. 13 is a graph illustrating the optimal envelope for minimum intermodulation distortion for a single-ended amplifier and a differential amplifier, according to certain embodiments.

FIG. 13 is a graph 1300 illustrating the optimal envelope tracking voltage corresponding to minimum intermodulation distortion for a single-ended amplifier and a differential amplifier. The y-axis indicates intermodulation distortion in dBm and the x-axis indicates the envelope tracking voltage $V_{ET}$ in volts. In an embodiment, the single-ended amplifier comprises the positive or the negative amplifier and the differential amplifier comprises the differential amplifier 1802 of FIG. 11. As illustrated in FIG. 11, each of the positive and negative amplifiers is injected with the envelope tracking voltage $V_{ET}$.

Trace 1302 illustrates the relationship between the envelope voltage $V_{ET}$ and the resultant intermodulation distortion for the single-ended amplifier. In the illustrated embodiment, the optimum envelope tracking voltage $V_{ET}$ is approximately 0.10 volts corresponding to the minimum intermodulation distortion of approximately −30 dBm.

Trace 1304 illustrates the relationship between the envelope voltage $V_{ET}$ and the resultant intermodulation distortion for the differential amplifier. In the illustrated embodiment, the optimum envelope tracking voltage $V_{ET}$ is approximately 0.10 volts corresponding to the minimum intermodulation distortion of approximately −24 dBm.

While the minimum resultant intermodulation distortion for the single-ended amplifier (trace 1302) is less than the minimum resultant intermodulation distortion for the differential amplifier (trace 1304), the optimum envelope tracking voltage $V_{ET}$ is approximately the same for the single-ended amplifier and the differential amplifier.

Figure 14:
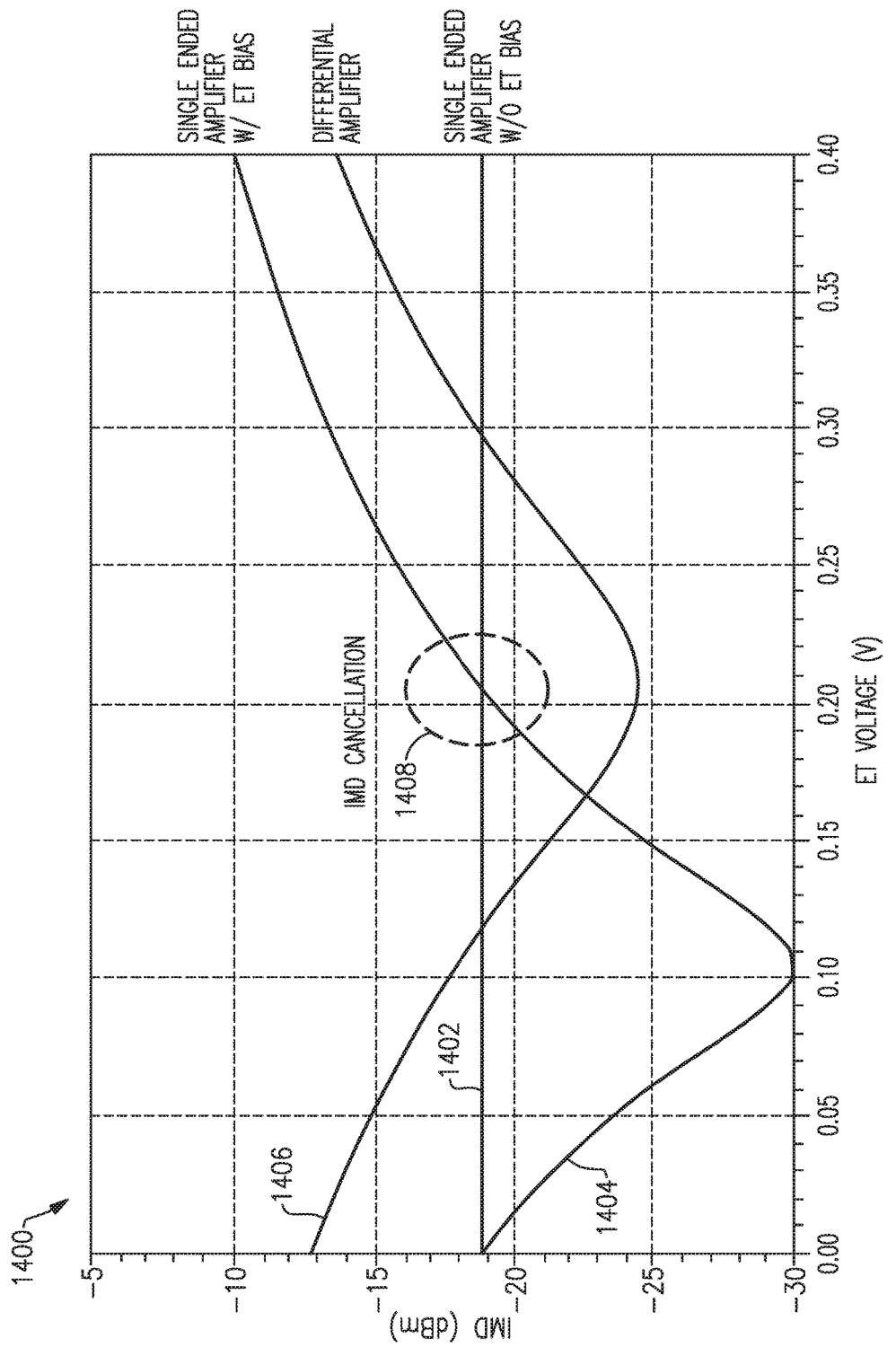
FIG. 14 is a graph illustrating the intermodulation distortion of a differential amplifier with envelope tracking voltage applied at one single-ended amplifier of the differential amplifier, according to certain embodiments.

FIG. 14 is a graph 1400 illustrating the optimal envelope tracking voltage $V_{ET}$ for a differential amplifier comprising a first single-ended amplifier without envelope-tracking bias and a second single-ended amplifier with envelope-tracking bias. The y-axis indicates intermodulation distortion in dBm and the x-axis indicates the envelope tracking voltage $V_{ET}$ in volts.

Trace 1402 illustrates the relationship between the resultant intermodulation distortion and the envelope tracking voltage $V_{ET}$ for the first single-ended amplifier without envelope-tracking bias. Since there is no envelope tracking voltage applied to the first amplifier, the resultant intermodulation distortion comprises a constant gate-to-gate intermodulation distortion measured at the output of the first single-ended amplifier.

Trace 1404 illustrates the relationship between the resultant intermodulation distortion and the envelope tracking voltage $V_{ET}$ for the second single-ended amplifier with envelope-tracking bias. In the illustrated example, the resultant intermodulation distortion is dominated by the gate-to-gate intermodulation distortion until the minimum resultant intermodulation distortion is reached at an optimal envelope tracking voltage of approximately 0.10 volts. After the optimal envelope tracking voltage is reached, the resultant intermodulation distortion is dominated by the gate-to-drain intermodulation distortion, which is opposite in phase from the gate-to-gate intermodulation distortion.

Trace 1406 illustrates the relationship between the resultant intermodulation distortion and the envelope tracking voltage $V_{ET}$ for the differential amplifier comprising the first and the second single-ended amplifiers. The minimum resultant intermodulation distortion for the differential amplifier occurs at approximately the intersection 1408 of the trace 1402 for the single-ended amplifier without envelope-tracking bias and the trace 1404 for the single-ended amplifier with envelope-tracking bias.

In the illustrated example, the minimum resultant intermodulation distortion for the differential amplifier occurs at approximately 0.20 volts. Thus, when envelope-tracking bias is applied to one single-ended amplifier of a differential amplifier, the optimal envelope tracking voltage corresponding to the minimum intermodulation distortion for the differential amplifier is approximately double the optimal envelope tracking voltage corresponding to minimum intermodulation distortion for the single-ended amplifier.

Combination or multistage amplifiers can comprise parallel amplifiers, cascaded amplifiers, differential amplifiers, fully differential amplifiers, and the like. Further, combination or multistage amplifiers can comprise power amplifiers (PAs), low noise amplifiers (LNAs), and the like.

For parallel amplifiers, improved linearization can be provided by applying or injecting an envelope tracking voltage $V_{ET}$ at each amplifier, where cancellation of the intermodulation distortion occurs within each amplifier. Improved linearization for parallel amplifiers can also be provided by applying or injecting an envelope tracking voltage $V_{ET}$ at only one amplifier, where cancellation of the intermodulation distortion occurs between or among the amplifiers. Applying or injecting the envelope tracking voltage Vet at only one amplifier advantageously simplifies the circuitry that is used to provide linearization for the parallel amplifier.

For cascade amplifiers, improved linearization can be provided by applying or injecting an envelope tracking voltage $V_{ET}$ at each amplifier, where cancellation of the intermodulation distortion occurs within each amplifier. Improved linearization for cascade amplifiers can also be provided by applying or injecting an envelope tracking voltage $V_{ET}$ at only one amplifier, where cancellation of the intermodulation distortion occurs between or among the amplifiers. Applying the envelope tracking voltage $V_{ET}$ at only one amplifier advantageously simplifies the circuitry that is used to provide linearization for the cascade amplifier. The further down the chain of cascaded amplifiers that the envelope tracking voltage $V_{ET}$ is injected, the envelope tracking voltage increases to minimize the resultant intermodulation distortion of the cascaded amplifier.

For differential amplifiers, improved linearization can be provided by applying or injecting an envelope tracking voltage $V_{ET}$ at each amplifier, where cancellation of the intermodulation distortion occurs within each amplifier. When the envelope tracking voltage $V_{ET}$ is applied to both amplifiers of the differential amplifier, the optimal envelope tracking voltage for the single-ended amplifiers and the differential amplifier are approximately the same.

Improved linearization for differential amplifiers can also be provided by applying or injecting an envelope tracking voltage $V_{ET}$ at only one amplifier. When the envelope tracking bias voltage is applied to one single-ended amplifier of the differential amplifier, the optimal envelope tracking voltage for the differential amplifier is approximately double the optimal envelope tracking voltage for the single-ended amplifier.

The linearity of an amplifier can be improved by reducing the third order intermodulation distortion caused by the intermodulation products generated by a two-tone input signal. At least a portion of the intermodulation products can be canceled by injecting a signal into the drain or collector of the amplifier where the signal comprises a frequency approximately equal to the difference in frequency between the two input tones and the signal has an amplitude that varies in synchronism with the envelope of the input signal.

Figure 15:
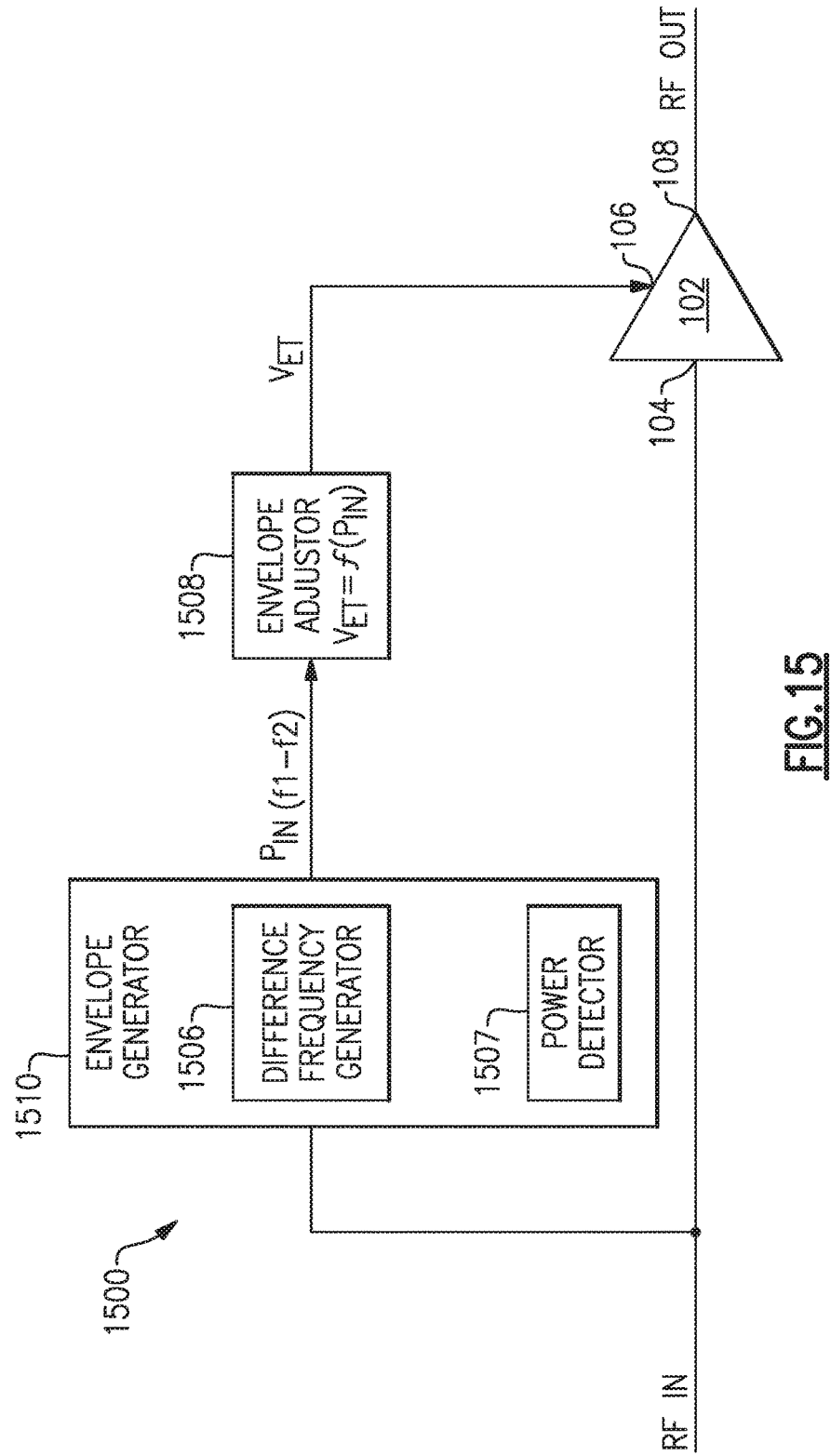
FIG. 15 is a schematic diagram of an exemplary linearization circuit, according to certain embodiments.

FIG. 15 is a block diagram of an exemplary linearization circuit 1500 configured generate the envelope tracking voltage $V_{ET}$ which when applied to the drain terminal 106 of the amplifier 102, 600, 602, 900, 902, 1802 cancels at least a portion of third order intermodulation distortion to improve linearity of the amplifier 102, 600, 602, 900, 902, 1802. The linearization circuit 1500 comprises an envelope adjustor 1508, and an envelope generator 1510. In an embodiment, the envelope generator 1510 comprises a difference frequency generator 1506 and a power detector 1507. In an embodiment, the difference frequency generator 1506 comprises a demodulator, an envelope detector, or the like.

In an embodiment, an input signal RF IN comprises at least a first frequency f1 and a second frequency f2 and has a power level $P_{IN}$. The envelope generator 1510 receives the input signal RF IN and outputs an output signal comprising a difference signal having a difference frequency f1-f2 and an envelope that is based at least in part on the power level $P_{IN}$ of the input signal RF IN In an embodiment, the envelope adjuster 1508 of the linearization circuit 1500 dynamically adjusts the amplitude of the difference signal (f1-f2) to track the RF envelope ($P_{IN}$) of the input signal (RF IN) at high instantaneous power. The adjusted signal ($V_{ET}$) is injected or applied to the drain or collector terminal 106 of the amplifier 102, 600, 602, 900, 902, 1802 to cancel at least a portion of the third order intermodulation distortion (IMD3) in the output signal (RF OUT). The adjusted signal $V_{ET}$ comprises the envelope tracking voltage.

The amplifier 102, 600, 602, 900, 902, 1802 receives the input signal at an input terminal and the envelope tracking voltage $V_{ET}$ at a drain terminal and generates an amplifier output signal RF OUT at an output terminal. In an embodiment, the amplifier output signal RF OUT comprises an amplified input signal. The amplifier 102, 600, 602, 900, 902, 1802 mixes the first and second frequency components of the input signal RF IN to generate intermodulation products of f1 and f2 in the amplifier output signal RF OUT. The application of the envelope tracking voltage $V_{ET}$ to the drain terminal of the amplifier 102, 600, 602, 900, 902, 1802 cancels at least a portion of the intermodulation products in the amplifier output signal RF OUT to improve amplifier linearity. In an embodiment, the injection of the envelope tracking voltage to the drain terminal cancels at least a portion of the third order f1 and f2 intermodulation products in the amplifier output signal RF OUT. In another embodiment, the injection of the envelope tracking voltage $V_{ET}$ to the drain terminal cancels at least a portion of the fifth order f1 and f2 intermodulation products in the amplifier output signal RF OUT.

In other words, without the application of the envelope tracking voltage $V_{ET}$ to the drain terminal of the amplifier 102, 600, 602, 900, 902, 1802, the amplifier output RF OUT comprises more intermodulation products and the amplifier 102, 600, 602, 900, 902, 1802 has reduced linearity because the cancelling effect of the envelope tracking voltage $V_{ET}$ on the intermodulation products is not present.

In an embodiment, the envelope adjustor 1508 comprises a shaping function to generate the voltage $V_{ET}$ representing the magnitude of the envelope of the difference signal. The magnitude of the envelope of the difference signal $V_{ET}$ is a function of the power in $P_{IN}$.

In another embodiment, the envelope adjuster 1508 comprises a shaping table to generate the envelope tracking voltage $V_{ET}$ representing the magnitude of the difference signal. The contents of the shaping table in the envelope path determine the mapping between the instantaneous RF envelope and the applied $V_{ET}$. It is this mapping that provides at least some cancellation of the third order and the fifth order intermodulation products. In an embodiment, input waveforms and a plurality of shaping functions are used to measure the third order intermodulation distortion over a plurality of combinations of input power and $V_{ET}$ to generate a shaping table for the amplifier 102 600, 602, 900, 902, 1802.

Figure 16:
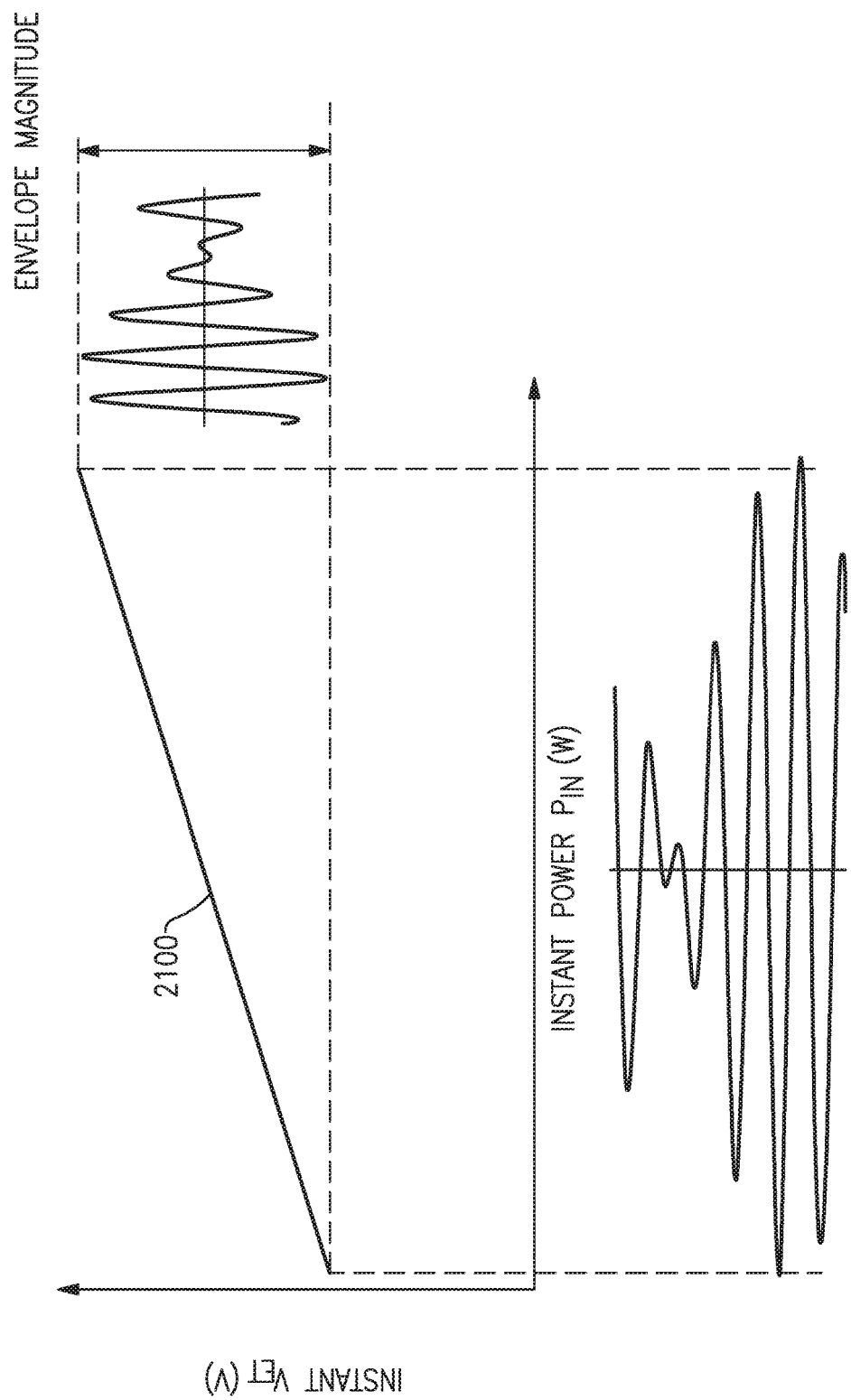
FIG. 16 is an exemplary graph illustrating the relationship between the envelope of the input signal and the shaping function, according to certain embodiments.

FIG. 16 is a graph illustrating an exemplary shaping function 2100 as the relationship between the instant $V_{ET}$ and the instant power $P_{IN}$ of the RF input signal. The instant power $P_{IN}$ in watts is shown on the x-axis and the instant $V_{ET}$ in volts is shown on the y-axis. In an embodiment, $V_{ET}$ is also described as the envelope tracking voltage.

In an embodiment, the shaping function 2100 is an adjustment of the envelope magnitude and the slope of the shaping function 2100 is equal to or approximately equal to the envelope magnitude. When the slope of the shaping function is zero, there is no envelope signal. As the slope of the shaping function 2100 increases, the envelope magnitude increases. To adjust the envelope, the envelope adjuster 1508 adjusts the slope of the shaping function.

Figure 17:
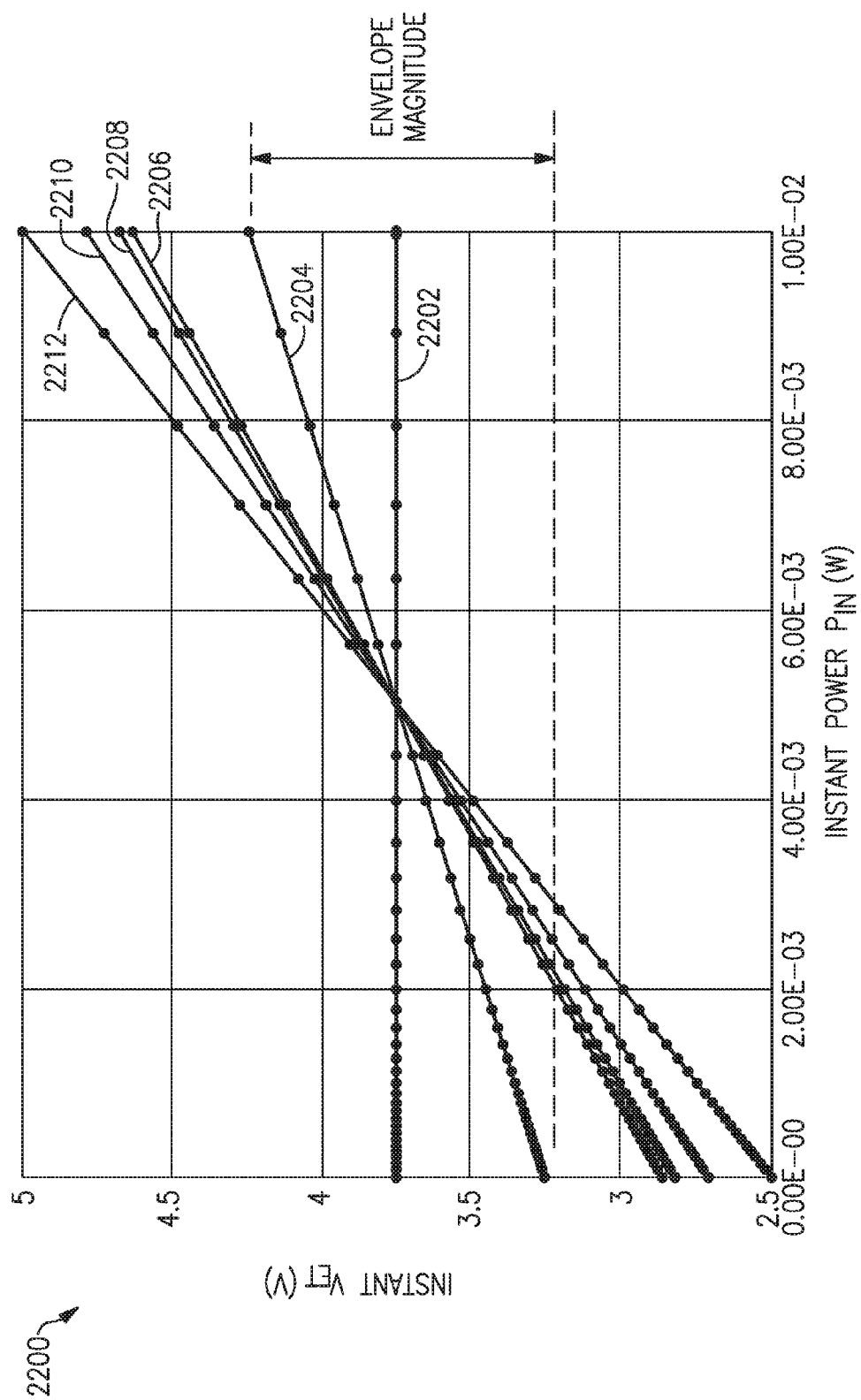
FIG. 17 is an exemplary graphical representation of a shaping table, according to certain embodiments.

FIG. 17 is a graph illustrating a plurality of shaping functions 2202, 2204, 2206, 2208, 2210, 2212, where each shaping function 2202, 2204, 2206, 2208, 2210, 2212 has a tuned slope. The instant power $P_{IN}$ in watts is shown on the x-axis and the instant $V_{ET}$ in volts is shown on the y-axis.

EXAMPLE 1

An envelope tracking test was performed on a test CMOS power amplifier 102 with the following conditions:
Vcc1=3.0 volts;
Vbias=0.23 volts;
Vcasc=2.7 volts;
Vcc2=2.5-5.0 volts;

Input Signal Frequency=2.6 GHz, chosen for maximum gain; and 2 tone test run with 2 tones 2 MHz apart (4 MHz spacing).

The linearization circuit 1500 applied the plurality of shaping functions 2202, 2204, 2206, 2208, 2210, 2212 to the CMOS power amplifier receiving the 2.6 GHz input signal with the 2 tones 2 MHz apart and the third order intermodulation distortion was measured.

Figure 18:
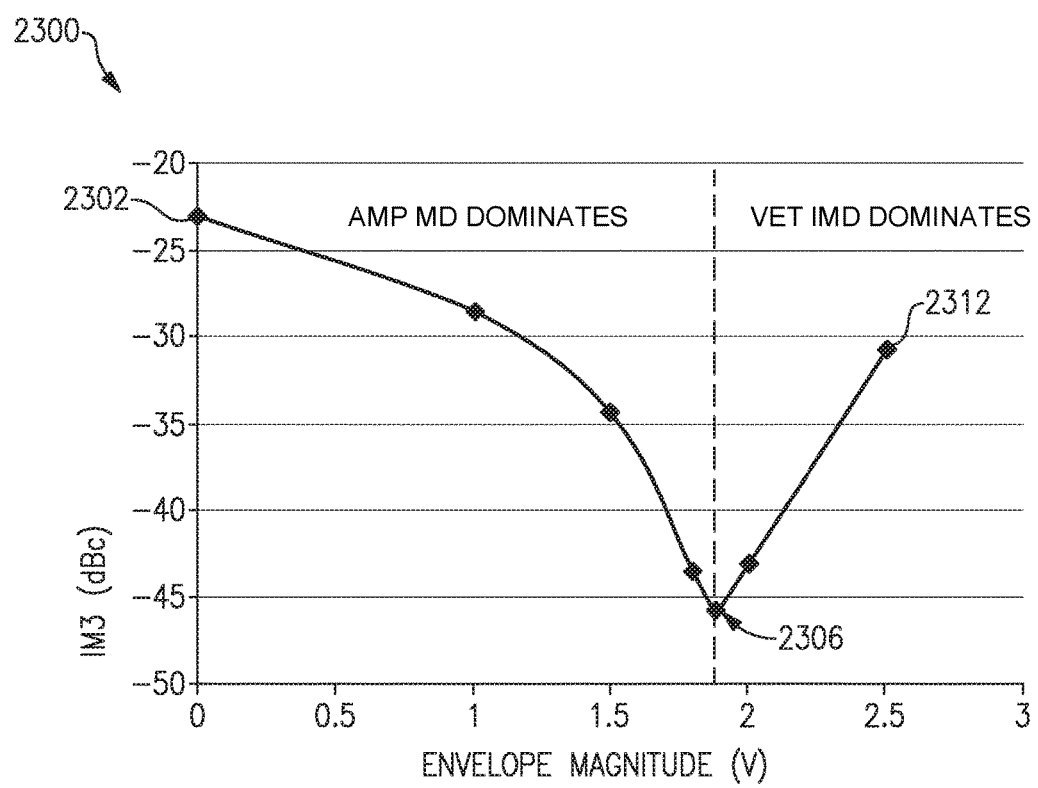
FIG. 18 is an exemplary graph illustrating the dependence of the third order intermodulation distortion on the envelope magnitude, according to certain embodiments.

FIG. 18 is an exemplary graph 2300 illustrating the dependence of the third order intermodulation distortion on the envelope magnitude, which is dependent upon the slope of the shaping function. The envelope magnitude in volts is shown on the x-axis and the third order intermodulation distortion (IM3) in dBc is shown on the y-axis, where dBc is the power ratio of a signal to a carrier signal.

For example, the measurement 2302 illustrates the maximum third order intermodulation distortion when the shaping function 2202 (slope=0) is applied. The measurement 2312 illustrates the third order intermodulation distortion when the shaping function 2212 is applied. The shaping function 2212 has the greatest slope of the plurality of shaping functions 2202, 2204, 2206, 2208, 2210, 2212 illustrated in graph 2200. The measurement 2306 illustrates the minimum third order intermodulation distortion when the tuned slope 2206 is applied.

To the left of the vertical dashed line in FIG. 18, the amplifier intermodulation dominates the third order intermodulation distortion and to the right of the vertical dashed line the mixer intermodulation distortion dominates. Thus, when the instantaneous input power is high, the instantaneous $V_{ET}$ determines the third order intermodulation distortion of the amplifier 102 and when the instantaneous input power is low, the amplifier intermodulation determines the third order intermodulation distortion.

Figure 19A:
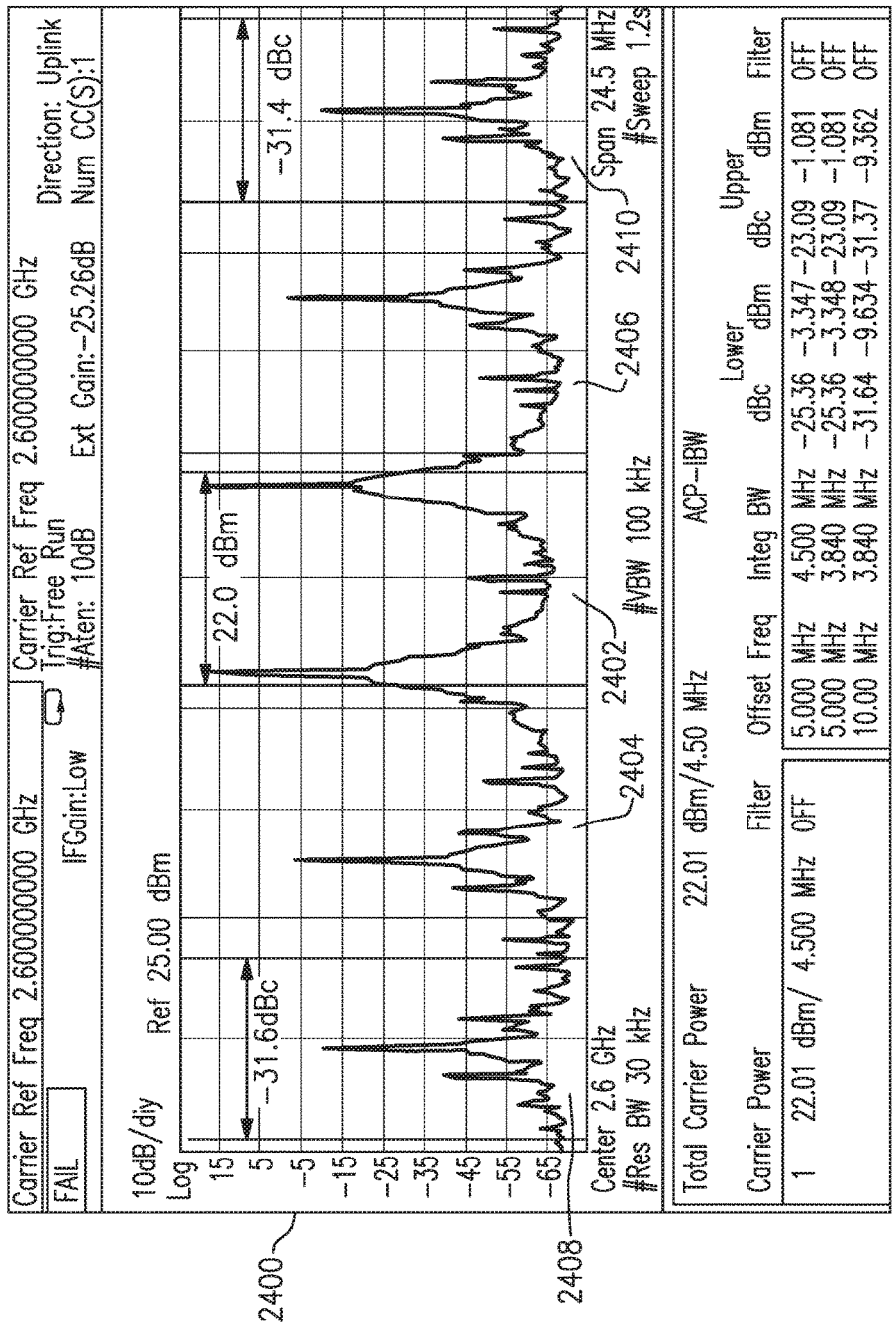
FIG. 19A is a plot of output signal power versus frequency for a radio frequency (RF) power amplifier without linearization, according to certain embodiments.

FIG. 19A is a plot 2400 of output signal power (y-axis) versus frequency (x-axis) for the test CMOS power amplifier without linearization, where Vdd=3.75 V.

Figure 19B:
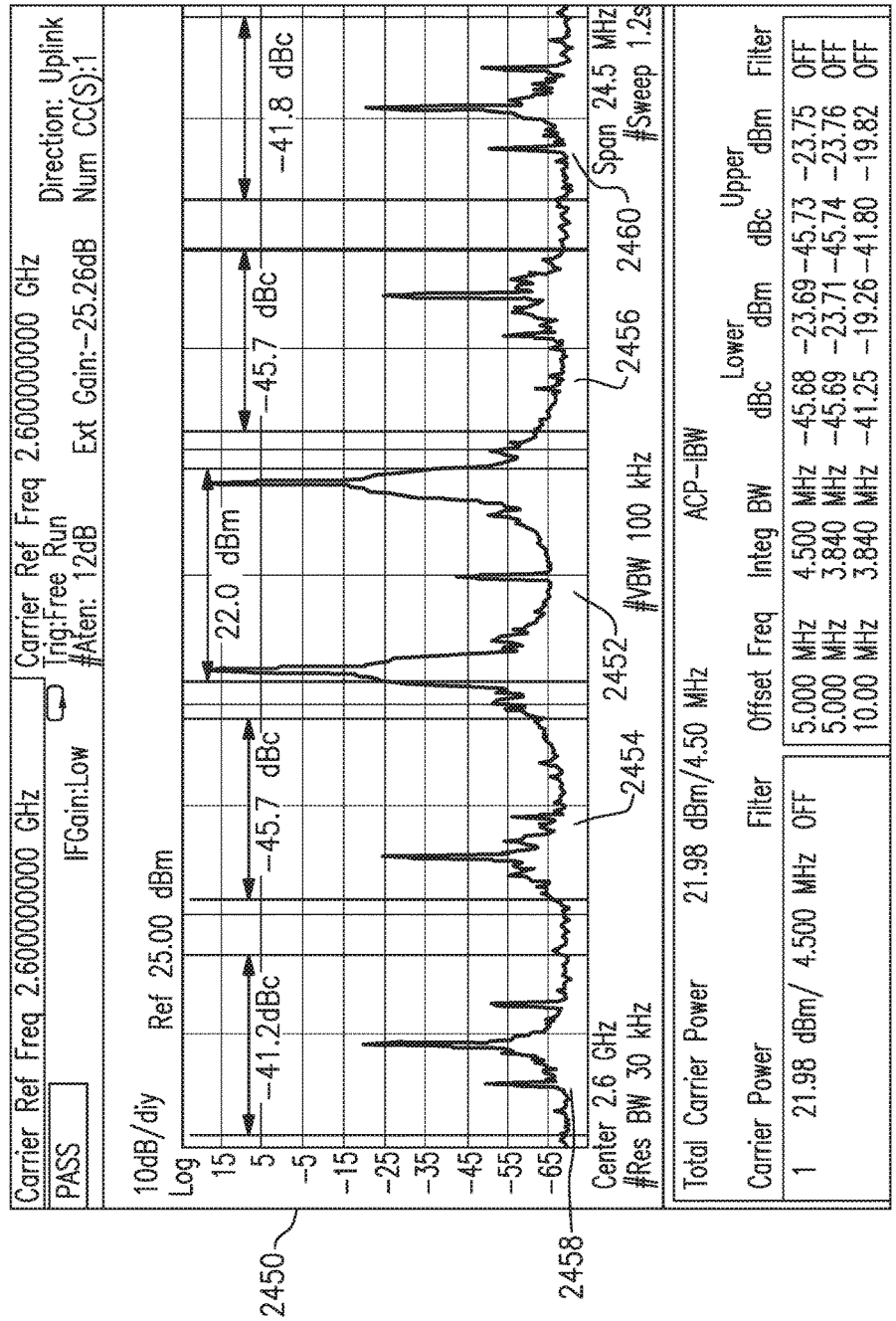
FIG. 19B is a plot of output signal power versus frequency for a RF power amplifier with linearization, according to certain embodiments.

FIG. 19B is a plot 2450 of output signal power (y-axis) versus frequency (x-axis) for the test CMOS power amplifier with linearization as described herein. The following shaping table was used:

| SHAPING TABLE | |
|---|---|
| $P_{IN}$ (W) | $V_{ET}$ (V) |
| 0 | 2 |
| 0.02 | 2.02 |
| 0.04 | 2.04 |
| 0.06 | 2.06 |
| 0.08 | 2.08 |
| 0.1 | 2.1 |
| 0.12 | 2.12 |
| 0.14 | 2.14 |
| 0.16 | 2.16 |
| 0.18 | 2.18 |
| 0.2 | 2.2 |

Referring to plots 2400, 2450, center bands 2402, 2452 show the 2.6 GHz carrier and the 2 tones 2 MHz apart from the carrier (the fundamental frequencies). Bands 2404 and 2406 of plot 2400 and bands 2454 and 2456 of plot 2450 show the third order intermodulation products of the 2 tones. Bands 2408 and 2410 of plot 2400 and bands 2458 and 2460 of plot 2450 show the fifth order intermodulation products of the 2 tones.

The third order intermodulation distortion in plot 2400 (no linearization) is approximately −23 dBc, while the third order intermodulation distortion in plot 2450 (with linearization) is approximately −45 dBc. The improvement in the third order intermodulation distortion as a result of applying linearization, such as linearization circuit 1500, is approximately −22 dB at constant output power.

Further, the fifth order intermodulation products (bands 2408, 2410) in the amplifier circuit without amplifier linearization are greater than the fifth order intermodulation products (bands 2458, 2460) in the amplifier circuit with the amplifier linearization.

Figure 20:
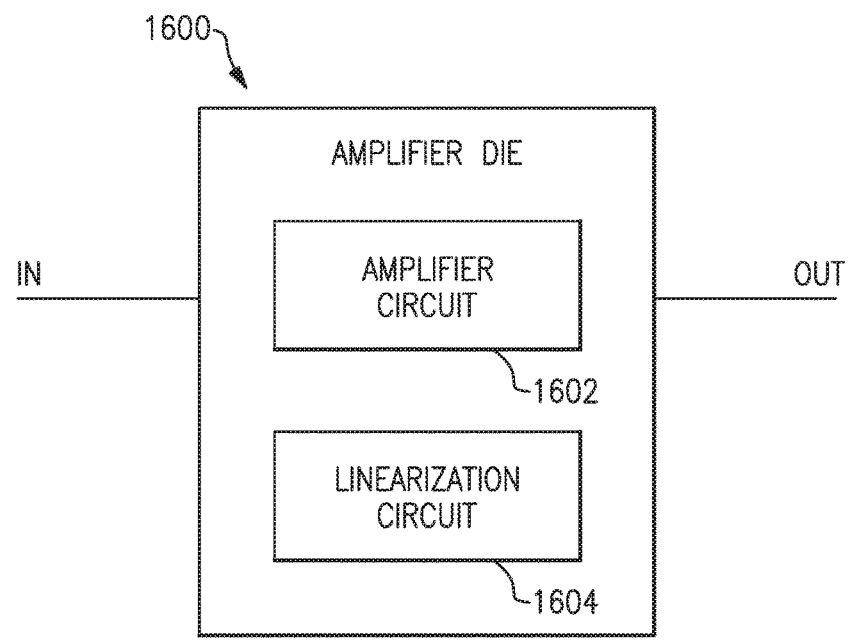
FIG. 20 is an exemplary block diagram of an amplifier die including a linearization circuit, according to certain embodiments.

FIG. 20 is an exemplary block diagram of an amplifier die 1600 including an embodiment of an amplifier circuit 1602 and an embodiment of an amplifier linearization circuit 1604. In an embodiment, the amplifier circuit 1602 comprises a low noise amplifier. In another embodiment, the amplifier circuit 1602 comprises a power amplifier. In a further embodiment, the amplifier circuit 1602 comprises the single-stage amplifier 102. In a yet further embodiment, the amplifier circuit 1602 comprises the multistage or combination amplifier 600, 602, 900, 902, 1802. In an embodiment, the amplifier linearization circuit 1604 comprises the linearization circuit 1500.

In an embodiment, the die 1600 comprises a silicon (Si) die. In an embodiment, the Si die comprises a Si CMOS die, a SiGe BiCMOS die, or the like. In another embodiment, the die 1600 comprises a gallium arsenide (GaAs) die, a heterojunction bipolar transistor (HBT) die, a pseudomorphic high electron mobility transistor (pHEMT) die, or the like.

Figure 21:
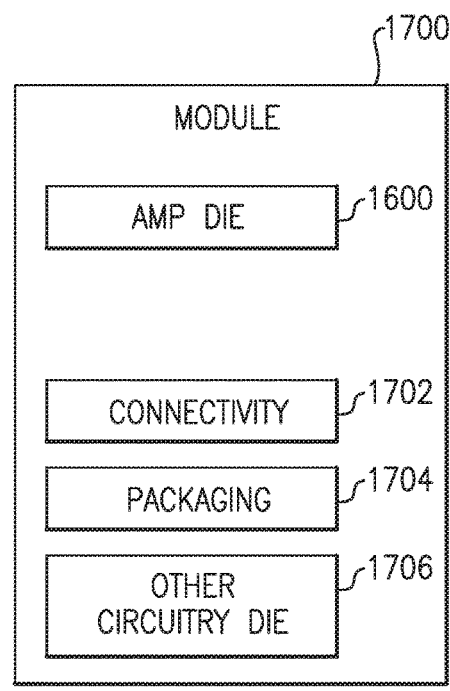
FIG. 21 is an exemplary block diagram of a multimode signal-processing module including the amplifier die of FIG. 16, according to certain embodiments.

FIG. 21 is an exemplary block diagram of a module 1700 including amplifier die 1600 of FIG. 20. The module 1700 further includes connectivity 1702 to provide signal interconnections, packaging 1704, such as for example, a package substrate, for packaging of the circuitry, and other circuitry die 1706, such as, for example amplifiers, prefilters, post filters modulators, demodulators, down converters, and the like, as would be known to one of skill in the art of semiconductor fabrication in view of the disclosure herein. In an embodiment, the module 1700 comprises a front-end module.

Figure 22:
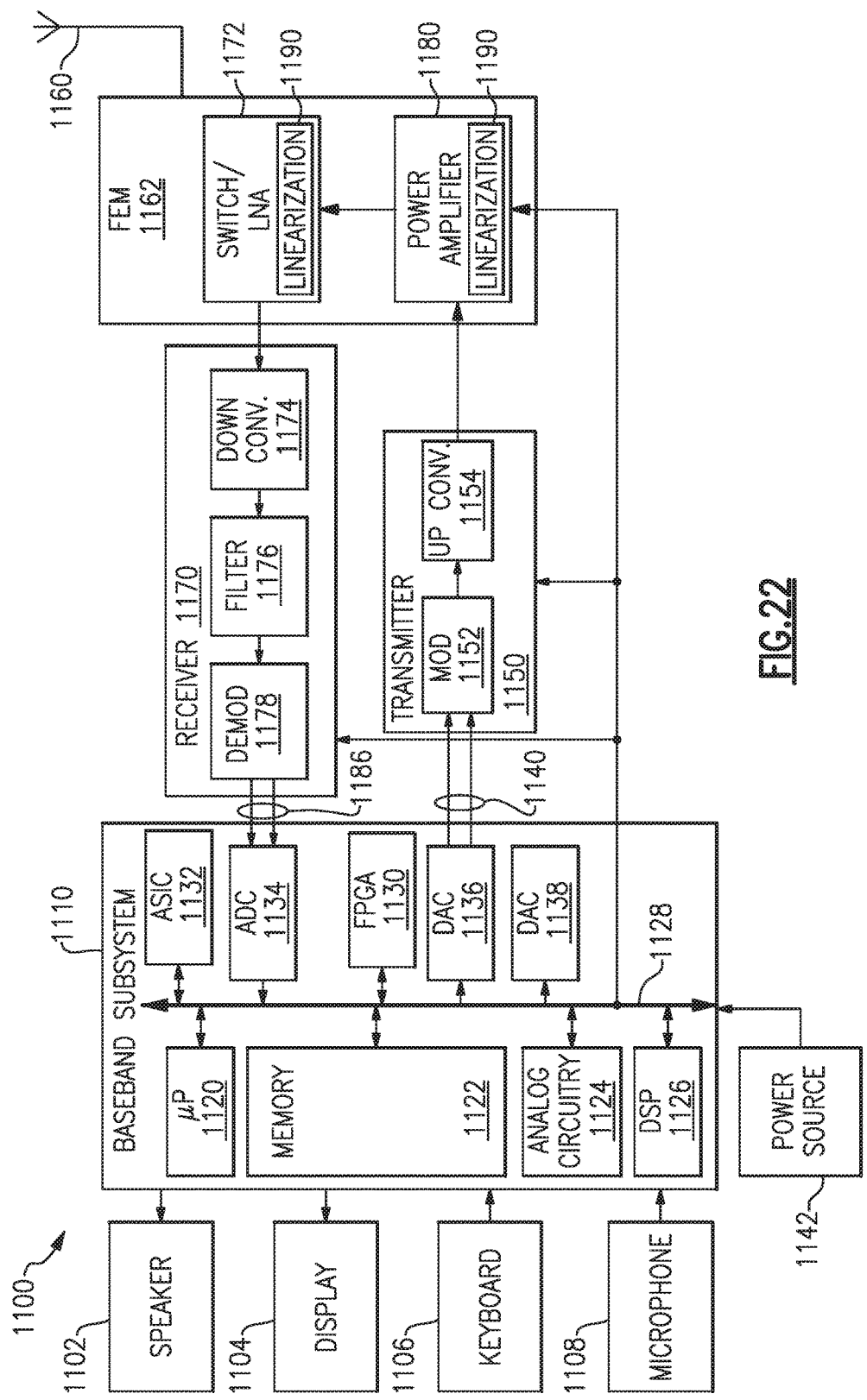
FIG. 22 is an exemplary block diagram illustrating a simplified portable transceiver including embodiments of amplifiers with linearization functionality, according to certain embodiments.

FIG. 22 is an exemplary block diagram illustrating a simplified portable transceiver 1100 including an embodiment of the amplifier linearization circuit 1500, 1604.

The portable transceiver 1100 includes a speaker 1102, a display 1104, a keyboard 1106, and a microphone 1108, all connected to a baseband subsystem 1110. A power source 1142, which may be a direct current (DC) battery or other power source, is also connected to the baseband subsystem 1110 to provide power to the portable transceiver 1100. In a particular embodiment, portable transceiver 1100 can be, for example but not limited to, a portable telecommunication device such as a mobile cellular-type telephone. The speaker 1102 and the display 1104 receive signals from baseband subsystem 1110, as known to those skilled in the art. Similarly, the keyboard 1106 and the microphone 1108 supply signals to the baseband subsystem 1110.

The baseband subsystem 1110 includes a microprocessor (μP) 1120, memory 1122, analog circuitry 1124, and a digital signal processor (DSP) 1126 in communication via bus 1128. Bus 1128, although shown as a single bus, may be implemented using multiple busses connected as necessary among the subsystems within the baseband subsystem 1110. The baseband subsystem 1110 may also include one or more of an application specific integrated circuit (ASIC) 1132 and a field programmable gate array (FPGA) 1130.

The microprocessor 1120 and memory 1122 provide the signal timing, processing, and storage functions for portable transceiver 1100. The analog circuitry 1124 provides the analog processing functions for the signals within baseband subsystem 1110. The baseband subsystem 1110 provides control signals to a transmitter 1150, a receiver 1170, and a power amplifier circuit 1180 comprising a power amplifier, for example.

It should be noted that, for simplicity, only the basic components of the portable transceiver 1100 are illustrated herein. The control signals provided by the baseband subsystem 1110 control the various components within the portable transceiver 1100. Further, the function of the transmitter 1150 and the receiver 1170 may be integrated into a transceiver.

The baseband subsystem 1110 also includes an analog-to-digital converter (ADC) 1134 and digital-to-analog converters (DACs) 1136 and 1138. In this example, the DAC 1136 generates in-phase (I) and quadrature-phase (Q) signals 1140 that are applied to a modulator 1152. The ADC 1134, the DAC 1136, and the DAC 1138 also communicate with the microprocessor 1120, the memory 1122, the analog circuitry 1124, and the DSP 1126 via bus 1128. The DAC 1136 converts the digital communication information within baseband subsystem 1110 into an analog signal for transmission to the modulator 1152 via connection 1140. Connection 1140, while shown as two directed arrows, includes the information that is to be transmitted by the transmitter 1150 after conversion from the digital domain to the analog domain.

The transmitter 1150 includes the modulator 1152, which modulates the analog information on connection 1140 and provides a modulated signal to upconverter 1154. The upconverter 1154 transforms the modulated signal to an appropriate transmit frequency and provides the upconverted signal to the power amplifier circuit 1180. The power amplifier circuit 1180 amplifies the signal to an appropriate power level for the system in which the portable transceiver 1100 is designed to operate.

Details of the modulator 1152 and the upconverter 1154 have been omitted, as they will be understood by those skilled in the art. For example, the data on connection 1140 is generally formatted by the baseband subsystem 1110 into in-phase (I) and quadrature (Q) components. The I and Q components may take different forms and be formatted differently depending upon the communication standard being employed.

A front-end module 1162 comprises the power amplifier (PA) circuit 1180 and a switch/low noise amplifier (LNA) circuit 1172 comprising a low noise amplifier. In an embodiment, the switch/low noise amplifier circuit 1172 further comprises an antenna system interface that may include, for example, a diplexer having a filter pair that allows simultaneous passage of both transmit signals and receive signals, as known to those having ordinary skill in the art.

In an embodiment, the front-end module 1162 further comprises one or more linearization circuits 1190. In an embodiment, the power amplifier circuit 1180 further comprises a first linearization circuit 1190, which cancels at least a portion of intermodulation signals, which in turn, reduces intermodulation distortion to improve linearity of the power amplifier in the power amplifier circuit 1180. In another embodiment, the low noise amplifier circuit 1172 further comprises a second linearization circuit 1190, which cancels at least a portion of the intermodulation signals, which in turn, reduces intermodulation distortion to improve linearity of the low noise amplifier in the switch/low noise amplifier circuit 1172. In an embodiment, the first and second linearization circuits 1190 comprise the module 1700. In another embodiment, the linearization circuits 1190 comprise the die 1600.

The power amplifier circuit 1180 supplies the amplified transmit signal to the switch/low noise amplifier circuit 1172. The transmit signal is supplied from the front-end module 1162 to the antenna 1160 when the switch is in the transmit mode.

A signal received by antenna 1160 will be directed from the switch/low noise amplifier circuit 1172 of the front-end module 1162 to the receiver 1170 when the switch is in the receive mode. The low noise amplifier circuit 1172 amplifies the received signal.

If implemented using a direct conversion receiver (DCR), the downconverter 1174 converts the amplified received signal from an RF level to a baseband level (DC), or a near-baseband level (approximately 100 kHz). Alternatively, the amplified received RF signal may be downconverted to an intermediate frequency (IF) signal, depending on the application. The downconverted signal is sent to the filter 1176. The filter 1176 comprises at least one filter stage to filter the received downconverted signal as known in the art.

The filtered signal is sent from the filter 1176 to the demodulator 1178. The demodulator 1178 recovers the transmitted analog information and supplies a signal representing this information via connection 1186 to the ADC 1134. The ADC 1134 converts these analog signals to a digital signal at baseband frequency and transfers the signal via bus 1128 to the DSP 1126 for further processing.

The methods and apparatus described herein provide intermodulation distortion cancellation using a straightforward mechanism having a significant effect with simple circuitry. Linearization described herein can be achieved In wide range of signal bandwidth, carrier frequency, RF power level, N-tone signals, and with different technology where $g_d>0$, $g_m>0$, and $g_{m3}<0$, such as, but not limited to MOS, MOSFET HBT, HEMT, pHEMT, GaN, and the like.

Terminology

Some of the embodiments described above have provided examples in connection with mobile phones. However, the principles and advantages of the embodiments can be used for any other systems or apparatus that have needs for power amplifier systems.

Such a system or apparatus can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone such as a smart phone, a telephone, a television, a computer monitor, a computer, a hand-held computer, a laptop computer, a tablet computer, a personal digital assistant (PDA), a PC card, a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods, apparatus, and systems described herein may be embodied in a variety of other forms; furthermore, various omissions, substitutions, and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method to improve amplifier linearity for a parallel amplifier, the method comprising:
   receiving at an input of a parallel amplifier a first signal including first signal components having a first frequency and second signal components having a second frequency, the parallel amplifier including at least a first amplifier circuit and a second amplifier circuit configured in parallel;
   generating a second signal having a third frequency approximately equal to a difference between the first frequency and the second frequency;
   adjusting an amplitude of the second signal based at least in part on a power level of the first signal and a tuned slope of a shaping function; and
   applying the adjusted signal to a direct current access terminal of the first amplifier circuit and not applying the adjusted signal to the second amplifier circuit to cancel at least a portion of intermodulation components in a third signal being output from the parallel amplifier, the direct current access terminal configured to receive a direct current signal.

2. The method of claim 1 wherein the intermodulation components include third order intermodulation products of the first and second frequencies.

3. The method of claim 1 wherein the first amplifier circuit includes one or more field effect transistors.

4. The method of claim 3 wherein the adjusted signal is applied to a drain of the first amplifier circuit.

5. The method of claim 1 wherein the first amplifier circuit includes one or more bipolar junction transistors.

6. The method of claim 5 wherein the adjusted signal is applied to a collector of the first amplifier circuit.

7. An amplifier linearization circuit assembly for reducing intermodulation distortion in a parallel amplifier, the amplifier linearization circuit assembly comprising:
   a difference frequency circuit configured to receive a first signal including a first frequency and a second frequency and to generate a second signal having a frequency approximately equal to a difference between the first frequency and the second frequency;
   an envelope generator configured to detect a power level of the first signal;
   an envelope adjustor configured to adjust a magnitude of the second signal based at least in part on the power level of the first signal and a tuned slope of a shaping function to provide an adjusted signal; and
   at least a first amplifier stage and a second amplifier stage configured as a parallel amplifier, when received at an input of the parallel amplifier, the first signal generating first intermodulation products between the first and second frequencies in an output signal of the parallel amplifier, the second amplifier stage further configured not to receive the adjusted signal and the first amplifier stage further configured to receive the adjusted signal at a direct current access terminal to generate second intermodulation products with the first signal that cancel at least a portion of the first intermodulation products, the direct current access terminal configured to receive a direct current signal.

8. The amplifier linearization circuit assembly of claim 7 wherein the parallel amplifier includes a power amplifier.

9. The amplifier linearization circuit assembly of claim 7 wherein the parallel amplifier includes a low noise amplifier.

10. The amplifier linearization circuit assembly of claim 7 wherein the first intermodulation products include third order intermodulation products of the first frequency and the second frequency.

11. The amplifier linearization circuit assembly of claim 7 wherein the first amplifier stage includes one or more field effect transistors.

12. The amplifier linearization circuit assembly of claim 11 wherein the adjusted signal is applied to a drain of the first amplifier stage.

13. The amplifier linearization circuit assembly of claim 7 wherein the first amplifier stage includes one or more bipolar junction transistors.

14. The amplifier linearization circuit assembly of claim 13 wherein the adjusted signal is applied to a collector of the first amplifier stage.

15. A wireless communication device comprising the amplifier linearization circuit assembly of claim 7.

16. A wireless communication device comprising:
an antenna configured to receive and transmit radio frequency signals;
a transceiver configured to provide the antenna with radio frequency signals for transmission and to receive from the antenna radio frequency signals for processing, the transceiver including a first amplifier circuit and a second amplifier circuit that are configured as a parallel amplifier to amplify a radio frequency input signal that includes a first frequency component having a first frequency and a second frequency component having a second frequency, the parallel amplifier including an input configured to receive the radio frequency input signal and an output configured to provide an amplified radio frequency signal that includes first intermodulation products between the first and second frequency components; and
an apparatus configured to reduce intermodulation distortion in the parallel amplifier, the apparatus including a difference frequency circuit configured to receive the radio frequency input signal that includes a first frequency and a second frequency and to generate a second signal having a frequency approximately equal to a difference between the first frequency and the second frequency, an envelope generator configured to detect a power level of the radio frequency input signal, and an envelope adjustor configured adjust an amplitude of the second signal based at least in part on the power level of the radio frequency input signal and a tuned slope of a shaping function to provide an adjusted signal, the second amplifier circuit further configured not to receive the adjusted signal and the first amplifier circuit further configured to receive the adjusted signal at a direct current access terminal to generate second intermodulation products with the first signal that cancel at least a portion of the first intermodulation products in the amplified radio frequency signal, the direct current access terminal configured to receive a direct current signal.

17. The wireless communication device of claim 16 wherein the parallel amplifier includes a power amplifier.

18. The wireless communication device of claim 16 wherein the parallel amplifier includes a low noise amplifier.

19. The wireless communication device of claim 16 wherein the first amplifier circuit includes one or more field effect transistors and the adjusted signal is applied to a drain of the first amplifier circuit.

20. The wireless communication device of claim 16 wherein the first amplifier circuit includes one or more bipolar junction transistors and the adjusted signal is applied to a collector of the first amplifier circuit.

* * * * *